(12) United States Patent
Sugita

(10) Patent No.: US 6,632,574 B1
(45) Date of Patent: Oct. 14, 2003

(54) MASK HAVING PATTERN AREAS WHOSE TRANSMISSION FACTORS ARE DIFFERENT FROM EACH OTHER

(75) Inventor: Mitsuro Sugita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/345,501

(22) Filed: Jul. 1, 1999

(30) Foreign Application Priority Data

Jul. 6, 1998 (JP) .............................. 10-205902

(51) Int. Cl.⁷ .............................. G03F 9/00; G03C 5/00
(52) U.S. Cl. .............................. 430/5; 430/311; 430/396
(58) Field of Search .............................. 430/5, 322, 323, 430/324, 394, 396, 311

(56) References Cited

U.S. PATENT DOCUMENTS

| | | | |
|---|---|---|---|
| 4,411,972 A | * 10/1983 | Narken et al. .................. | 430/5 |
| 4,876,164 A | * 10/1989 | Watakabe et al. ............... | 430/5 |
| 4,902,899 A |   2/1990 | Lin et al. .................. | 250/492.1 |
| 5,194,346 A | * 3/1993 | Rolfson et al. ................. | 430/5 |
| 5,532,089 A |   7/1996 | Adair et al. .................... | 430/5 |
| 5,700,606 A | * 12/1997 | Kobayashi et al. ............. | 430/5 |
| 5,723,234 A | * 3/1998 | Yokoyama et al. ............ | 430/5 |
| 5,906,910 A | * 5/1999 | Nguyen et al. ............. | 430/311 |

FOREIGN PATENT DOCUMENTS

| | | |
|---|---|---|
| JP | 63-304257 | 12/1988 |
| JP | 3-263313 | 11/1991 |
| JP | 7-226362 | 8/1995 |
| JP | 8-76351 | 3/1996 |
| JP | 11-143085 | 5/1999 |

* cited by examiner

Primary Examiner—Mark F. Huff
Assistant Examiner—Saleha R. Mohamedolla
(74) Attorney, Agent, or Firm—Fitzpatrick, Cella, Harper & Scinto

(57) ABSTRACT

A mask is composed of a substrate, and a pattern having a transmission factor formed on the substrate by using a material, wherein an optical path length difference between light beams respectively passing the pattern and an area adjacent thereto is greater than $$\left(m - \frac{1}{8}\right)\lambda$$

and less than $$\left(m + \frac{1}{8}\right)\lambda,$$

where $\lambda$ is a wavelength of incident light, and $m$ is an integer.

16 Claims, 19 Drawing Sheets

1 0 1 0 1 0 1 0 1 0 1

IN THE CASE OF NEGATIVE RESIST

IN THE CASE OF POSITIVE RESIST (a) IN THE CASE OF NEGATIVE RESIST    (b) IN THE CASE OF POSITIVE RESIST

AMOUNT OF EXPOSURE $E > E_{th}$

FILM THICKNESS d AFTER DEVELOPING

INCIDENT LIGHT

TRANSMITTED LIGHT

$$\begin{cases} T = e^{-cd} & \longleftarrow \text{TRANSMISSION FACTOR} \\ \theta = 2\pi \dfrac{nd}{\lambda} & \longleftarrow \text{PHASE CHANGE} \end{cases} \Bigg\} \text{FORMULAS (1)}$$

$$d = \frac{(-\log T)}{c}$$

$$\theta = 2\pi \frac{n}{\lambda} \frac{(-\log T)}{c}$$

INCIDENT LIGHT

50%     100%

TRANSMITTED LIGHT $$\begin{cases} T = e^{-cd} & \longleftarrow \text{TRANSMISSION FACTOR} \\ \theta = 2\pi \dfrac{nd}{\lambda} = 2m\pi & \longleftarrow \text{PHASE CHANGE} \end{cases}$$

$$\left. \begin{array}{c} d = \dfrac{m\lambda}{n} = \dfrac{(-\log T)}{c} \\ \\ \boxed{\dfrac{n}{c} = \dfrac{m\lambda}{(-\log T)}} \end{array} \right\} \text{FORMULAS (2)}$$

INCIDENT LIGHT

50% 100%
TRANSMITTED LIGHT $$\begin{cases} T = \dfrac{e^{-c_1 d_1}}{e^{-c_2 d_2}} & \leftarrow \text{TRANSMISSION FACTOR RATIO} \\ \theta = 2\pi \dfrac{n_1 d_1 - n_2 d_2}{\lambda} = 2m\pi & \leftarrow \text{PHASE CHANGE DIFFERENCE} \end{cases}$$

FORMULAS (3)

$c_2 = 0, m = 0$ $$\begin{aligned} d_1 &= \frac{(-\log T)}{c_1} \\ d_2 &= \frac{n_1}{n_2} d_1 \end{aligned}$$

FORMULAS (4)

MASK HAVING PATTERN AREAS WHOSE TRANSMISSION FACTORS ARE DIFFERENT FROM EACH OTHER

BACKGROUND OF THE INVENTION

1. Field of the Invention

The present invention relates to a mask for use in exposing a photosensitive substrate with a pattern designed for devices, such as a semiconductor including an IC, an LSI, etc., a liquid crystal panel, a magnetic head and a CCD (image sensor), and an exposure method and an exposure apparatus which use the mask, and more particularly, relates to a mask, an exposure method and an exposure apparatus which are adapted for manufacturing such devices to a high degree of integration.

2. Description of Related Art

Heretofore, in manufacturing an IC, an LSI, a liquid crystal element, etc., by photolithography techniques, a projection exposure apparatus is used which performs an exposure by projecting through a projection optical system a pattern of a photomask or a reticle (hereinafter referred to generally as "mask") onto a photosensitive substrate, such as a wafer or a glass plate, which is coated with a photoresist or the like.

In recent years, the degree of integration of devices, such as an IC, an LSI and a liquid crystal element, is increasing more and more. As one of demands for minute and fine working of semiconductor wafers according to such an increase of the degree of integration, a device pattern is required to be more finely and minutely formed, i.e., to have a higher resolution.

For such a requirement, the projection exposure technique, which plays a main role in the art of accomplishing minute work, is being developed these days so as to form a pattern image of a line width not greater than 0.5 μm over a wider range.

FIG. 21 is a schematic diagram showing the arrangement of a conventional exposure apparatus.

In FIG. 21, there are illustrated an excimer laser light source 171, an illumination optical system 172, illumination light 173, a mask 174, object-side exposure light 175, a projection optical system 176, image-side exposure light 177, a photosensitive substrate (wafer) 178, and a substrate stage 179 arranged to hold the photosensitive substrate 178.

In the conventional exposure apparatus shown in FIG. 21, a laser beam emitted from the excimer laser light source 171 is led to the illumination optical system 172. At the illumination optical system 172, the laser beam is converted into the illumination light 173 having a predetermined light intensity distribution, a predetermined luminous distribution, etc., and the illumination light 173 is then made incident on the mask 174. On the mask 174, a circuit pattern which is to be formed on the photosensitive substrate 178 is beforehand formed with chromium or the like in a predetermined magnified size. The illumination light 173, passing through the mask 174, is diffracted by the circuit pattern to be converted into the object-side exposure light 175. The projection optical system 176 converts the object-side exposure light 175 into the image-side exposure light 177 to image the circuit pattern on the photosensitive substrate 178 at a predetermined magnification with sufficiently small aberrations. As shown in an enlarged view at the lower portion of FIG. 21, the image-side exposure light 177 converges on the photosensitive substrate 178 at a predetermined NA (numerical aperture=sin θ) to be imaged there. To have the circuit pattern formed in a plurality of shot areas on the photosensitive substrate 178, the substrate stage 179 is arranged to be movable stepwise to vary the relative positions of the photosensitive substrate 178 and the projection optical system 176.

In the above projection exposure apparatus using an excimer laser, which is currently widely used, however, it is difficult to form a pattern image of a line width not greater than 0.15 μm.

The reason for this difficulty is explained below. The resolution of the projection optical system is limited by a trade-off between the optical resolution and the depth of focus due to the wavelength of the exposure light. The resolution R and the depth of focus DOF in the resolving pattern by the projection exposure apparatus can be expressed by the following Rayleigh's formulas (a1) and (a2):

$$R = k_1 \frac{\lambda}{NA} \tag{a1}$$

$$DOF = k_2 \frac{\lambda}{NA^2} \tag{a2}$$

where λ is the wavelength of the exposure light, NA is a numerical aperture indicative of the brightness of the optical system, $k_1$ and $k_2$ are constants which are determined by the developing process characteristic, etc., of the photosensitive substrate and are normally between 0.5 and 0.7.

According to the formulas (a1) and (a2), in order to make the value of the resolution R smaller for a higher degree of resolution, it is necessary either to make the wavelength λ smaller for a shorter wavelength or to make the NA larger for a higher degree of brightness. At the same time, however, the depth of focus DOF required for a necessary performance of the projection optical system must be kept at least at a certain value. This requirement imposes some limitation on the increase of the NA. As a result, the shortening of the wavelength is considered a sole solving method.

The attempt to shorten the wavelength, however, encounters several serious problems other than the problem related to the above formulas. The most serious problem lies in that it becomes hardly impossible to find any optical material usable for the projection optical system. An optical system which is actually mountable on the exposure apparatus as the current projection optical system in view of the amount of aberration, the precision of working, the controllability, etc., is one including a refractive system, i.e., a lens. Almost all optical materials used for lenses have transmission factors near "0" in the short wavelength region, i.e., in the far ultraviolet region. Although there are a fused quartz material, etc., as an optical material which is manufactured by a special manufacturing method for an exposure apparatus, the transmission factor of the fused quartz also abruptly drops for the wavelength not greater than 193 nm. It is thus extremely difficult to develop any optical material practically usable for an exposure wavelength not greater than 150 nm required for a pattern of a line width not greater than 0.15 μm, because the optical material is required to satisfy a plurality of conditions relative to durability, uniform refractive index, optical strain, workability, etc., in addition to the transmission factor.

The above conventional projection exposure method necessitates the shortening of the wavelength for performing a pattern exposure depending on the formulas (a1) and (a2), and, therefore, causes a problem in that there exists no usable optical material, so that it is impossible to realize an exposure for a pattern image of a line width not greater than 0.15 μm.

There is another exposure method called a two-light-flux interference exposure method. FIG. 22 is a schematic diagram for explaining the two-light-flux interference exposure method. According to the two-light-flux interference exposure method, coherent light emitted from a laser light source 71 is divided by a half-mirror 72 into two light fluxes. Mirrors 73a and 73b are arranged to deflect the two light fluxes respectively at some angles to cause the two light fluxes to join together on a photosensitive substrate 74 in such a way as to form interference fringes there. Then, the photosensitive substrate 74 is exposed according to a distribution of light intensity made by the interference fringes, so that a periodic pattern is formed according to the distribution of light intensity.

The resolution R obtained by the two-light-flux interference exposure method is expressed by the following formula (a3), where the resolution R is assumed to be the width of each of lines and spaces (L&S), i.e., the width of each of bright and dark bands of the interference fringes, e represents the angle of incidence on the photosensitive substrate 74 of each of the two light fluxes 71a and 71b, and NA sin θ.

$$R = \frac{\lambda}{4\sin\theta} \quad (a3)$$
$$= \frac{\lambda}{4NA}$$
$$= 0.25 \frac{\lambda}{NA}$$

As is understandable from the formulas (a3) and (a1), the constant $k_1$ becomes 0.25 ($k_1$=0.25) according to the two-light-flux interference exposure method. Considering that the value of the constant $k_1$ in the case of the conventional projection exposure method is between 0.5 and 0.7, the resolution obtainable by the two-light-flux interference exposure method is more than two times as high as the resolution obtainable by the conventional projection exposure method. According to the two-light-flux interference exposure method, assuming that λ is 0.248 μm and NA is 0.6, for example, the resolution R becomes 0.10 μm.

However, the two-light-flux interference exposure method presents a fundamental problem in that it is impossible to perform an exposure with a circuit pattern composed of diverse shapes like semiconductor element patterns. In other words, according to the two-light-flux interference exposure method, only such a pattern that has a uniform pitch over the whole area where the two light fluxes are joined together is substantially available for exposure. In order to improve such a problem, a method is conceivable, for example, in which a diaphragm is set near the surface of the photosensitive substrate 74 to limit an area to be exposed and an exposure is performed with the pattern of several lines and spaces required for a specific pattern, while changing the exposure direction and moving the exposure position. However, in a case where such a method is executed, at the same time that a small diaphragm is provided to limit the exposure area to a sufficiently small area, a distribution of light intensity would be changed due to the diffraction of individual light fluxes themselves, so that it becomes impossible to form effective interference fringes.

While, according to the two-light-flux interference exposure method, the resolution corresponding to the line width of not greater than 0.15 μm can be accomplished, the resolvable pattern is limited to a repetitive pattern of uniform pitch, so that it is impossible to perform an exposure with sufficiently various kinds of circuit patterns required for the practical semiconductor devices.

Further it is widely known that the Levenson-type reticle is used in order to realize the two-light-flux interference exposure method using a projection exposure apparatus. However, there is a problem that it is difficult to make such a Levenson-type reticle that has sufficiently various kinds of circuit patterns required for the practical semiconductor devices. In addition, in the case of usage of the Levenson-type reticle, the oblique incidence illumination is inferior in contrast, and there is such a limitation that the inclination of an incident light beam has no freedom (allowing only one angle).

To solve the above problems, a multiple exposure method using both a two-light-flux interference exposure and a projection exposure has been proposed in Japanese Patent Application Laid open No. 11-143085.

Next, the multiple exposure method proposed in Japanese Patent Application Laid open No. 11-143085 will be explained taking an example thereof.

One of circuit patterns which are obtainable according to the multiple exposure method is a so-called gate pattern as shown in FIG. 12. The gate pattern has such a characteristic that the line width in the horizontal direction is 0.1 μm while the line width in the vertical direction is 0.2 μm. For such a pattern that a high resolution is required only in a one-dimensional direction, an exposure in the two-light-flux interference exposure step can be performed only in the one-dimensional direction requiring a high resolution.

As examples of exposure apparatuses capable of attaining the two-light-flux interference exposure, there are an exposure apparatus shown in FIG. 22 and a projection exposure apparatus shown in FIG. 23, which is capable of selecting masks and illumination methods as shown in FIGS. 24(A) and 24(B) and FIG. 25.

It is to be noted that the term "projection exposure" in the current description is used in the narrow sense. Specifically, the projection exposure in the broad sense includes an exposure system in which the two-light-flux interference exposure is substantially attained by adaptively selecting and adjusting the mask and the illumination method as shown in FIG. 23. On the other hand, in the projection exposure in the narrow sense, an exposure with an arbitrary pattern formed on the mask is performed by using convergent light fluxes incident on the image plane at various angles including two parallel light fluxes.

First, an explanation is made about the exposure apparatus shown in FIG. 22. In the exposure apparatus, the line width of an interference pattern obtainable by exposure is expressed by the above formula (a3) according to the angle of incidence θ of each of two light fluxes which are joined together. Here, the angle θ and the NA are in the relation of "NA=sin θ". Since the angle e is settable to an arbitrary value by adjusting the angle of the mirror 73a or 73b, it is possible to greatly decrease the line width of an interference pattern by setting the angle θ to a larger value. For example, in a case where a KrF laser of wavelength 248 nm is used as a light source, assuming that the angle θ is set to 38 degrees, the possible line width of an interference pattern becomes 0.1 μm. In this instance, the NA (=sin θ) is 0.62. If the angle θ is set to a larger value, a higher resolution can be obtained.

Next, an explanation is made about the exposure apparatus shown in FIG. 23. The exposure apparatus shown in FIG. 23 is provided with a projection optical system, which is conventionally available and is entirely composed of, for example, refractive systems, and may have the NA not less than 0.6 for the wavelength 248 nm. In FIG. 23, the illustration includes a mask 81, object-side exposure light 82, a projection optical system 83, an aperture stop 84, image-side exposure light 85, a photosensitive substrate 86, and a schematic view 87 showing the positions of light fluxes at the pupil surface of the projection optical system 83.

In the schematic diagram of FIG. 23, which shows the state of the exposure apparatus where the two-light-flux interference exposure is being performed, each of the object-side exposure light 82 and the image-side exposure light 85 is composed of two parallel light fluxes.

In such an ordinary projection exposure apparatus, the two-light-flux interference exposure can be performed by setting the mask 81 and the illumination method as shown in FIGS. 24(A), 24(B) and 25, which will be explained below as three examples.

In the example shown in FIG. 24(A), there is illustrated a Levenson-type phase shifting mask 90, in which the pitch $P_0$ of chromium-made light-blocking parts 91 is expressed by the following formula (a4) and the pitch $P_{OS}$ of phase shifters 92 is expressed by the following formula (a5):

$$P_0 = \frac{P}{M} = \frac{2R}{M} = \frac{\lambda}{2NA \cdot M} \quad (a4)$$

$$P_{OS} = 2P_0 = \frac{\lambda}{NA \cdot M} \quad (a5)$$

where P is the pitch of interference fringes, M is the magnification of the projection optical system 83, $\lambda$ is the wavelength, and NA is the image-side numerical aperture of the projection optical system 83.

Further, in the example shown in FIG. 24(B), there is illustrated a phase shifting mask 93 of the shifter-edge type having no chromium-made light-blocking part, in which the pitch $P_{OS}$ of phase shifters 92 is expressed by the above formula (a5) as in the case of the Levenson type.

In each of the phase shifting masks 90 and 93 shown in FIGS. 24(A) and 24(B), when the illumination is performed with parallel light fluxes which are made vertically incident (coherence factor $\sigma=0$), vertically-transmitted light fluxes cancel each other and disappear because the phase difference between adjacent transmitted light fluxes is made to be $\pi$ by the phase shifters 92. Then, two light fluxes for ± first-order diffracted light, which strengthen each other, occur symmetrically with respect to the optical axis of the projection optical system. Further, second-order or higher-order diffracted light does not contribute to the image formation, owing to the limitation of the NA of the projection optical system.

In the example shown in FIG. 25, there is illustrated an ordinary chromium mask 101, in which the pitch $P_0$ of chromium-made light-blocking parts is expressed by the following formula (a6), which is the same as the formula (a4):

$$P_0 = \frac{P}{M} = \frac{2R}{M} = \frac{\lambda}{2NA \cdot M} \quad (a6)$$

In the case of the mask having no phase shifting structure, as shown in FIG. 25, illumination light is subjected to the oblique incidence illumination. In this case, incident light is composed of parallel light fluxes having an angle of incidence $\theta_0$. Here, the angle of incidence $\theta_0$ is expressed by the following formula (a7):

$$\sin \theta_0 = M \cdot NA \quad (a7)$$

With respect to such incident light, light having passed through the mask 101 is composed of two light fluxes, i.e., zero-order diffracted light which advances at the angle $\theta_0$ relative to the optical axis of the projection optical system in the same way as the incident light and –first-order diffracted light which advances at the angle $-\theta_0$ symmetrically to the zero-order diffracted light with respect to the optical axis of the projection optical system. Then, the two light fluxes pass through the projection optical system and contribute to the image formation.

The above explanation has been made about examples of the mask and the illumination method for performing the two-light-flux interference exposure using the ordinary projection exposure apparatus. With the above-described setting, a maximum area of the NA of the projection optical system can be utilized.

Subsequently, an explanation is made back about the exposure method. In the above example, the two-light-flux interference exposure step (FIG. 13(A)) is followed by the projection exposure step, which is executed to perform an exposure with a pattern shown in FIG. 13(B). In the upper portion of FIG. 13(B), there are shown amounts of exposure on the individual areas in the projection exposure step with regard to the positions of interference fringes formed by the two-light-flux interference exposure step. In the lower portion of FIG. 13(B), there are shown the amounts of exposure in the form of a map at the resolution of a pitch of 0.1 $\mu$m.

Here, it is found that the line width of the pattern formed by the projection exposure step is 0.2 $\mu$m, which is twice as large as that formed by two-light-flux interference exposure step.

Further, as one of methods for performing a projection exposure in which amounts of exposure differ with the individual areas, as described above, there is a method of using a mask having a plurality of steps of transmission factors, in which a mask part corresponding to the area indicated by "1" in FIG. 13(B) is assigned a transmission factor of T% and a mask part corresponding to the area indicated by "2" in FIG. 13(B) is assigned a transmission factor of 2T%. According to this method, the projection exposure step can be completed by one exposure. In this case, a ratio among the amounts of exposure obtained on the photosensitive substrate by the respective exposure steps is as follows: "two-light-flux interference exposure":"projection exposure at the part of transmission factor T%":"projection exposure at the part of transmission factor 2T%"=1:1:2.

Further, there is another method in which an exposure is performed twice at the same amount of exposure by using two masks having respective different patterns as shown in the upper and lower portions of FIG. 13(D).

Next, the formation of a lithography pattern by the combination of the two-light-flux interference exposure step and the projection exposure step is described. In the case of such a multiple exposure method, there is no developing step between the two-light-flux interference exposure step and the projection exposure step. Therefore, the amount of exposure obtained by one exposure step is added to the amount of exposure obtained by the other exposure step. Then, a total amount of exposure obtained by the addition causes a new exposure pattern (distribution of latent images or distribution of amounts of exposure) to be formed.

FIG. 13(C) illustrates the results of addition of the amounts of exposure obtained by the above two kinds of exposure steps. Particularly, in the lower portion of FIG. 13(C), a lithography pattern obtained by developing the exposure pattern shown at the upper portion of FIG. 13(C) is shown in a gray tone. Additionally stated, the exposure threshold value of the photosensitive substrate used in the above example is a value not less than "1" and less than "2".

The lithography pattern shown in gray at the lower portion of FIG. 13(C) coincides with the gate pattern shown in FIG. 12, so that it is found that the above multiple exposure method enables the formation of such a complicated minute pattern.

As a result of diligent studies of the inventor of the present invention, it is found that the following problem arises in a case where the conventional half-tone mask is used as a half-tone mask provided with a light-transmitting part whose transmission factor is not 100%, as described by referring to the upper portion of FIG. 13(B).

FIG. 26 schematically shows the manner of the projection exposure in a case where an exposure with the above gate pattern is performed on the resist by using a half-tone mask.

In the upper portion of FIG. 26, there is illustrated a multivalued half-tone mask for use in the projection exposure step to form the gate pattern. In this case, three values of transmission factors are provided, i.e., 0%, 50% and 100%. In the middle portion of FIG. 26, there are shown the transmission factor, the amount of phase change of transmitted light and the complex amplitude transmission factor, which are obtained on a section B–B' of the half-tone mask.

The conventional half-tone mask is accompanied by the phase shifting effect, which aims at improving the resolution by varying the complex amplitude transmission factor according to the amount of phase change and adjusting the amplitude corresponding to an exposure pattern. Therefore, the amount of phase change of the conventional half-tone mask takes a value of, for example, π, as shown in FIG. 26.

If such a half-tone mask is used for the above-described multiple exposure, although the numerical values of the transmission factors are set to 0%, 50% and 100%, the complex amplitude transmission factors become 0%, −50% and 100%, so that there exists a portion in which the complex amplitude transmission factor becomes "0" at the boundary between 50% and 100%. Accordingly, the actual transmission factor, i.e., the amount of exposure, becomes "0" in the vicinity of the portion in which the complex amplitude transmission factor becomes "0", as shown in the lower portion of FIG. 26. Such abnormality makes it impossible to obtain a desired, continuous multivalued half-tone mask required for the above multiple exposure.

BRIEF SUMMARY OF THE INVENTION

It is an object of the invention to eliminate the problems arising when the above half-tone mask is used for the multiple exposure and to provide a mask and an exposure method using the mask, which make it possible to form on a wafer a pattern of line width not greater than 0.15 µm even by means of the ordinary projection exposure apparatus, and which enable a high-integrated device to be readily manufactured.

To attain the above object, in accordance with a first aspect of the invention, there is provided a mask, which comprises a substrate, and a pattern having a transmission factor formed on the substrate by using a material, wherein an optical path length difference between light beams respectively passing the pattern and an area adjacent thereto is greater than $$\left(m - \frac{1}{8}\right)\lambda$$

and less than $$\left(m + \frac{1}{8}\right)\lambda,$$

where λ is a wavelength of incident light, and m is an integer.

In accordance with a second aspect of the invention, there is provided a mask, which comprises a substrate, and a pattern having a reflection factor formed on the substrate by using a material, wherein an optical path length difference between light beams respectively passing the pattern and an area adjacent thereto is greater than $$\left(m - \frac{1}{8}\right)\lambda$$

and less than $$\left(m - \frac{1}{8}\right)\lambda$$

where λ is a wavelength of incident light, and m is an integer.

In particular, the best value of the optical path length difference in each of the first and second aspects is m·λ in principle.

Specifically, in the mask according to the first or second aspect, the wavelength λ is in the following range:

150 nm<λ<440 nm.

In accordance with a third aspect of the invention, there is provided an exposure method, which comprises a step of performing an exposure by, while using the mask according to the first or second aspect, forming a pattern image of the mask on a photosensitive substrate.

In accordance with a fourth aspect of the invention, there is provided an exposure method, which comprises a projection exposure step of performing a projection exposure on a photosensitive substrate by using a pattern of the mask according to the first or second aspect, and a two-light-flux interference exposure step of exposing the photosensitive substrate with interference fringes (pattern) based on two-light-flux interference.

In accordance with a fifth aspect of the invention, there is provided an exposure apparatus, which has an exposure mode related to one or both of the exposure methods according to the third and fourth aspects.

In accordance with a sixth aspect of the invention, there is provided a device manufacturing method, which comprises a process of transferring a device pattern of a reticle to a wafer by using one of the exposure methods according to the third and fourth aspects, and a process of developing the wafer.

The above and further aspects and features of the invention will become apparent from the following detailed description of preferred embodiments thereof taken in conjunction with the accompanying drawings.

DETAILED DESCRIPTION OF THE INVENTION

Hereinafter, preferred embodiments of the invention will be described in detail with reference to the drawings.

First, an explanation is made, by referring to FIGS. 1 to 9, about the principle of a multiple exposure method in which a two-light-flux interference exposure and a projection exposure using a half-tone mask according to the invention are contained.

Figure 1:
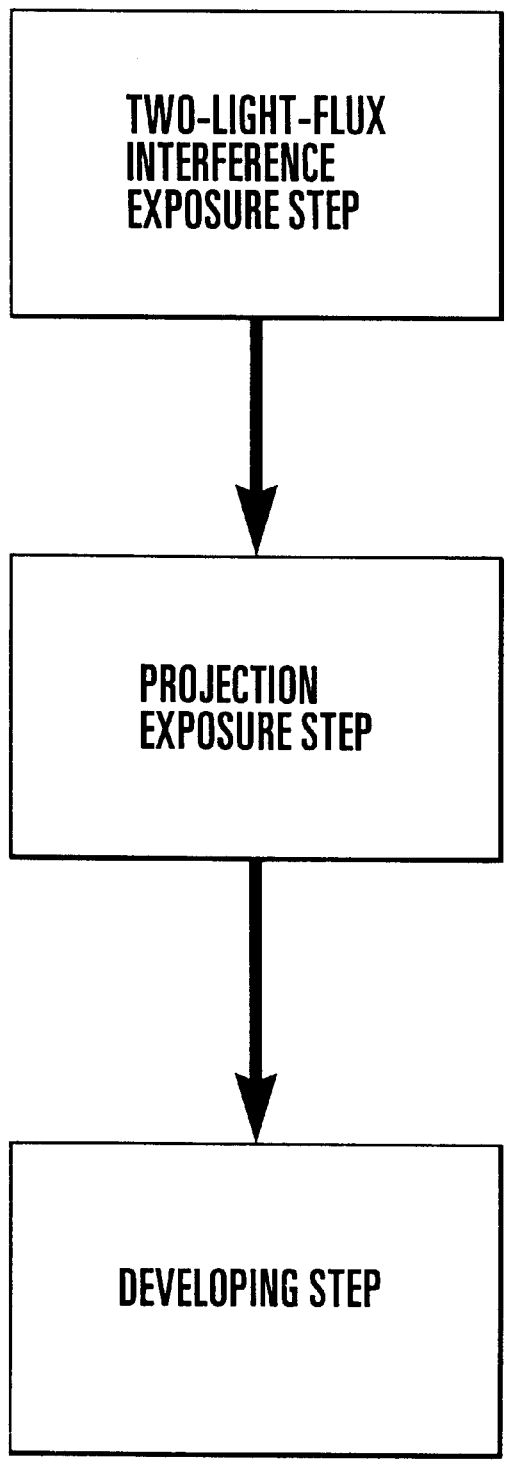
FIG. 1 is a flow chart showing a multiple exposure method according to the invention.

FIG. 1 is a flow chart showing the basic flow of the multiple exposure method according to the invention. In FIG. 1, there are shown a two-light-flux interference exposure step, a projection exposure step and a developing process, which constitute the multiple exposure method according to the invention. The sequence of the two-light-flux interference exposure step and the projection exposure step does not have to be the order shown in the flow chart of FIG. 1. The projection exposure step may be executed prior to the two-light-flux interference exposure step, and the two-light-flux interference exposure step and the projection exposure step may be executed concurrently. Further, in a case where each of the two-light-flux interference exposure step and the projection exposure step is to be executed a plurality of times, the two-light-flux interference exposure step and the projection exposure step may be alternately executed. Furthermore, some alignment step or the like may be inserted between the two-light-flux interference exposure step and the projection exposure step so as to enhance the precision of image formation. Thus, the structural arrangement according to the invention is not limited by the flow chart of FIG. 1.

Figure 2A:
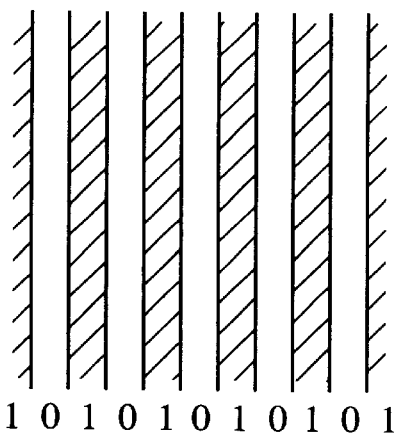
FIGS. 2(A) and 2(B) are schematic diagrams showing an exposure pattern obtained by the two-light-flux interference exposure method.
Figure 2A:
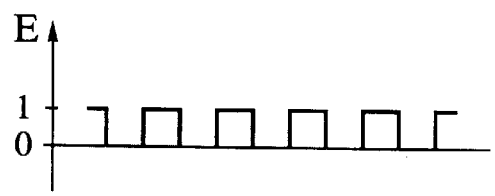
Figure 2B:
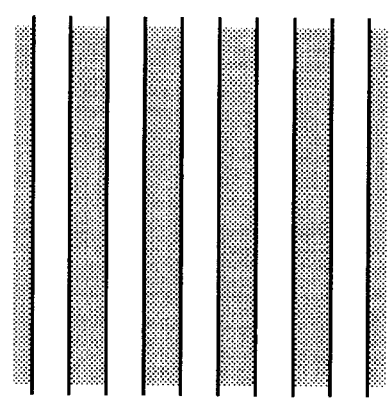
Figure 2B:
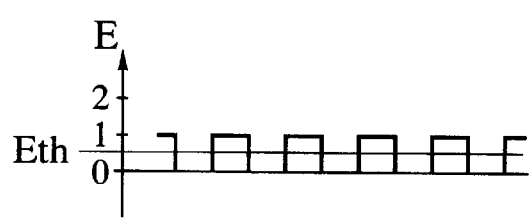

In the case of the multiple exposure method shown in the flow chart of FIG. 1, first, a photosensitive substrate is exposed with a periodic pattern composed of interference fringes brought about by the interference of two light fluxes. FIG. 2(A) is a schematic diagram showing such a periodic pattern. In FIG. 2(A), each numeral indicates the amount of exposure (exposure amount), and the exposure amount of each of hatched parts is "1" while that of each of white parts is "0". In developing the photosensitive substrate exposed with the above periodic pattern, an exposure threshold value Eth of the photosensitive substrate is generally set to a value between "0" and "1", so that a pattern image as shown in FIG. 2(B) can be obtained.

Figure 3A:
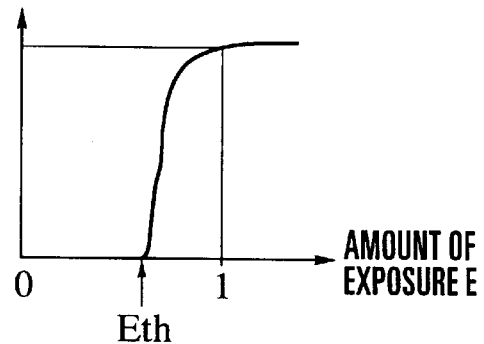
FIGS. 3(A) and 3(B) are graphs showing exposure sensitivity characteristics of resists.
Figure 3B:
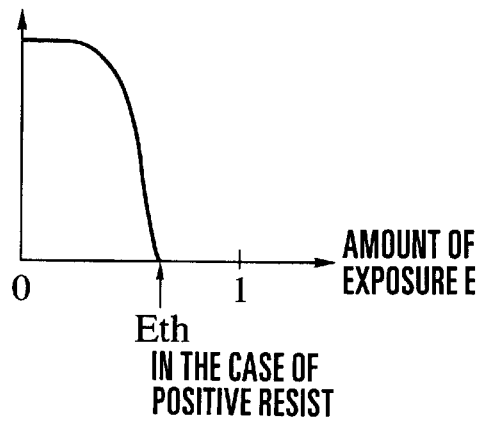

FIGS. 3(A) and 3(B) show the dependency on the exposure amount E of the film thickness "d" after developing of a resist part of the photosensitive substrate and the exposure threshold value Eth for the negative resist and for the positive resist, respectively. The film thickness "d" after developing becomes "0" at a portion where the exposure has been made to an exposure amount equal to or greater than the exposure threshold value Eth in the case of the positive resist, or where the exposure has been made to an exposure amount equal to or less than the exposure threshold value Eth in the case of the negative resist.

Figure 4:
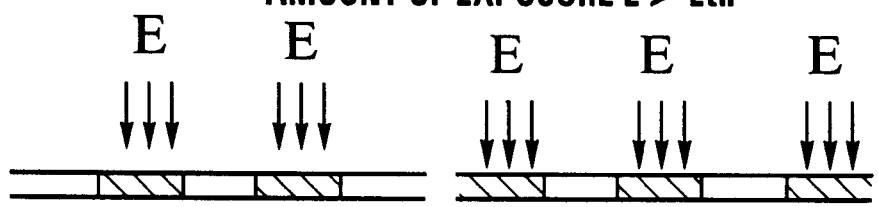
FIG. 4 is a schematic diagram showing the formation of a pattern by a developing process.
Figure 4:
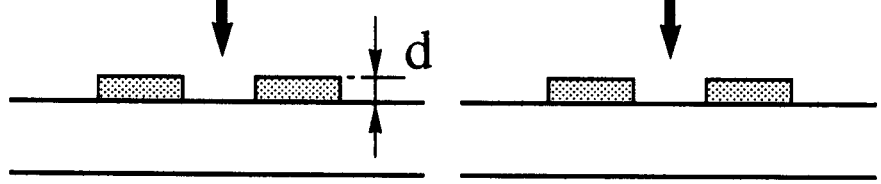
Figure 4:
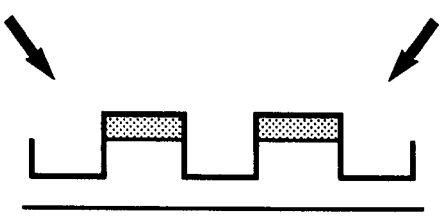
Figure 4:
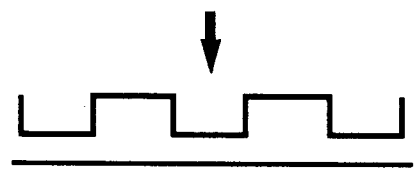

FIG. 4 schematically shows, for each of the positive resist and the negative resist, the manner in which a lithography pattern is formed through developing and etching processes after the above-stated exposure.

In the case of the multiple exposure method shown in FIG. 1, if a maximum exposure amount for the two-light-flux interference exposure step is set to "1", the exposure threshold value of the resist is set to a value greater than "1".

In the photosensitive resist as set in the above manner, in a case where an exposure pattern obtained as shown in FIG. 2(A) by carrying out only the two-light-flux interference exposure is developed, the exposure amount is insufficient, and although the film thickness somewhat varies, there exists no portion where the film thickness becomes "0", so that no lithography pattern is formed. Thus, the two-light-flux interference exposure pattern can be considered to have disappeared. (In the following, the use of a negative resist is described by way of example. However, the invention is of course not limited to the use of the negative type nor that of the positive type. Both types of resists are selectively usable as desired in accordance with the invention.)

The principle of the multiple exposure method according to the invention lies in the following point. A high-resolution repetitive pattern which seems to disappear if processed by the two-light-flux interference exposure step alone is merged with a pattern obtained by the projection exposure step using a half-tone mask. Then, the high-resolution repetitive pattern is selectively revived by the above merger and is reproduced to form a lithography pattern as desired.

Next, the arrangement of essential parts of an exposure apparatus in which a mask according to the invention is used is described with reference to FIG. 5.

Figure 5:
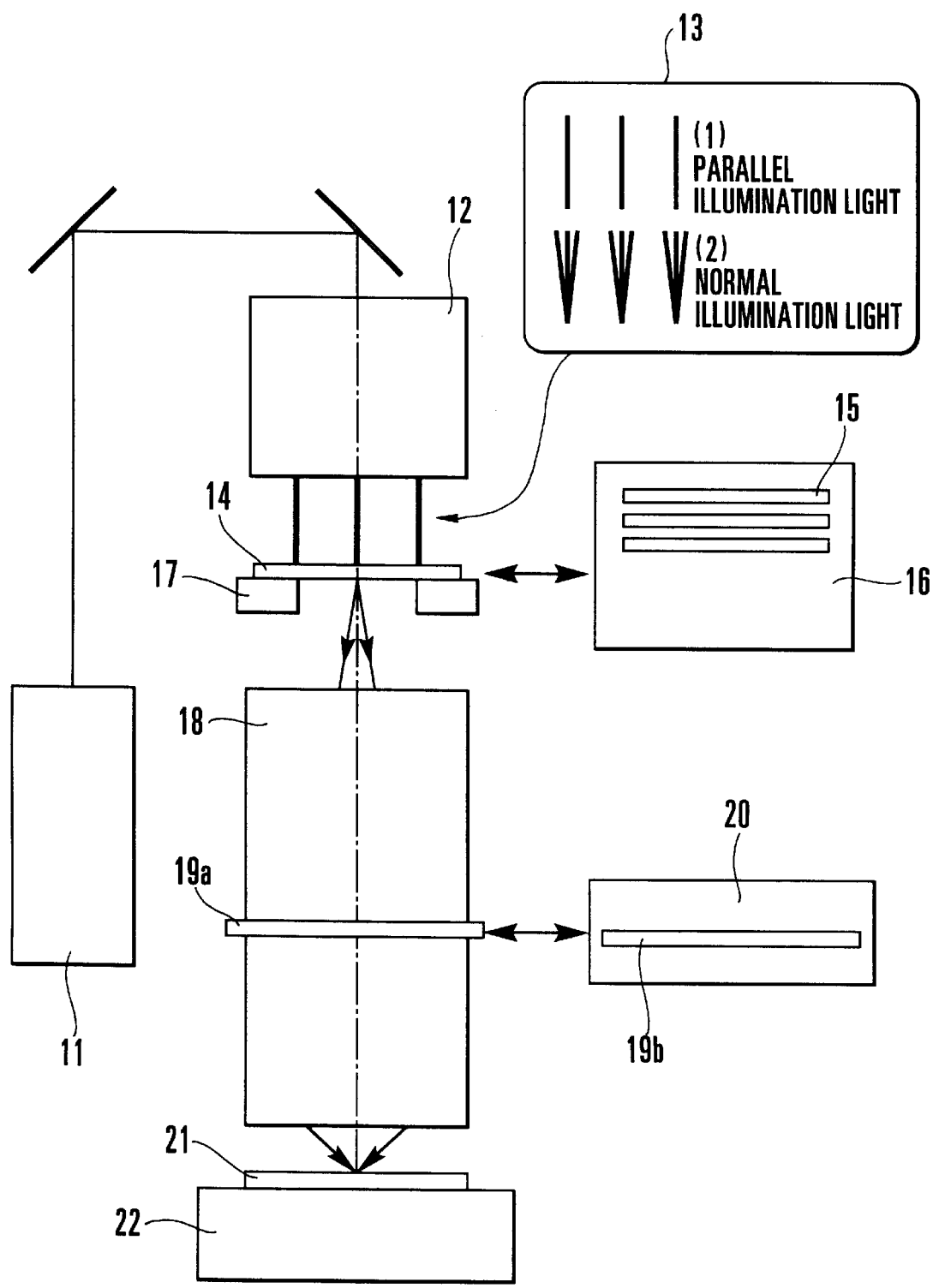
FIG. 5 is a diagram showing in outline the arrangement of essential parts of an exposure apparatus according to the invention.

FIG. 5 shows in outline the arrangement of essential parts of the exposure apparatus according to the invention. In FIG. 5, there are illustrated an exposure light source 11, an illumination optical system 12, a schematic view 13 showing illumination modes, a mask (half-tone mask) 14 according to the invention, a mask 15 for replacement with the mask 14, a mask changer 16, a mask stage 17, a projection optical system 18, pupil filters 19a and 19b, a pupil filter changer 20, a wafer 21, and a wafer stage 22.

In the exposure apparatus shown in FIG. 5, when the two-light-flux interference exposure is to be performed, the pupil filter as indicated by 19a in FIG. 5 is used with the illumination method set to the coherent illumination (the so-called small-σ (coherence factor) illumination using parallel or approximately-parallel fluxes incident on the mask), and the mask is changed over to a two-light-flux interference mask, which will be described later. Further, when the ordinary projection exposure is to be performed, the pupil filter as indicated by 19b in FIG. 5 is used, or no pupil filter is used with all the pupil filters retracted, with the illumination method changed over to the partly-coherent illumination or the like, and the mask is changed over to an applicable mask.

Figure 6:
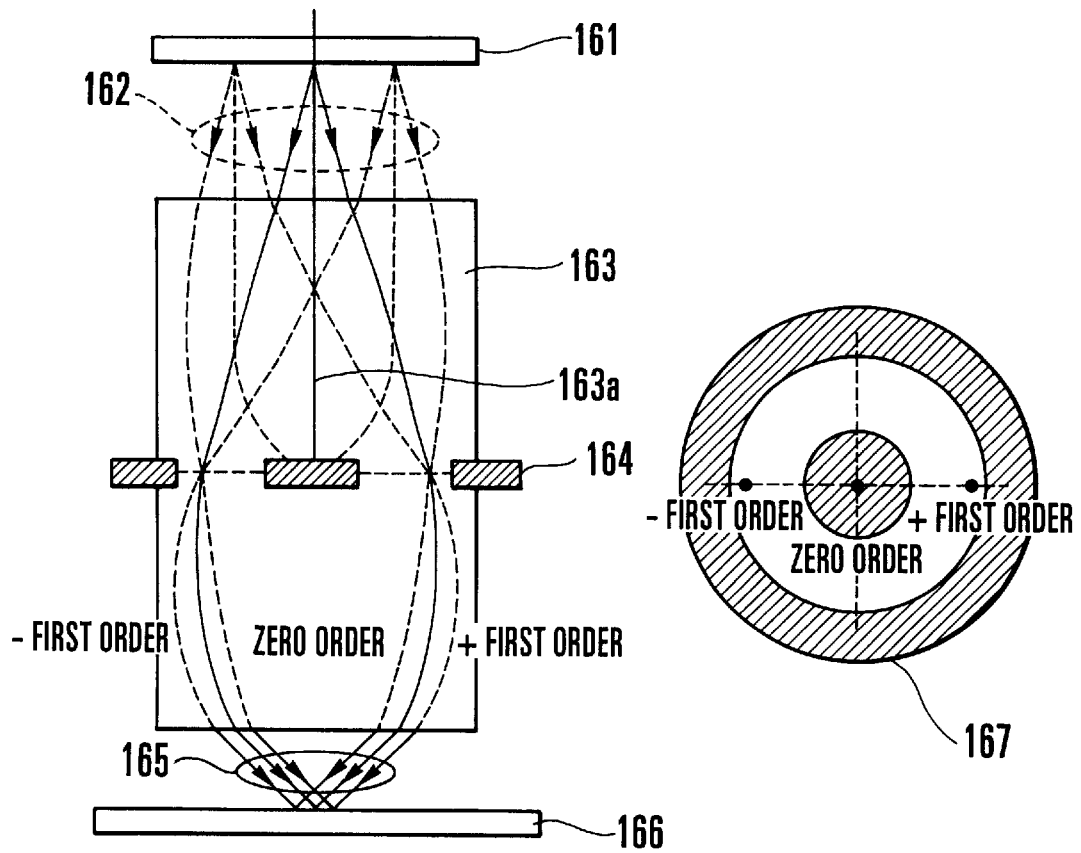
FIG. 6 is a schematic diagram showing the two-light-flux interference exposure according to the invention.
Figure 7:
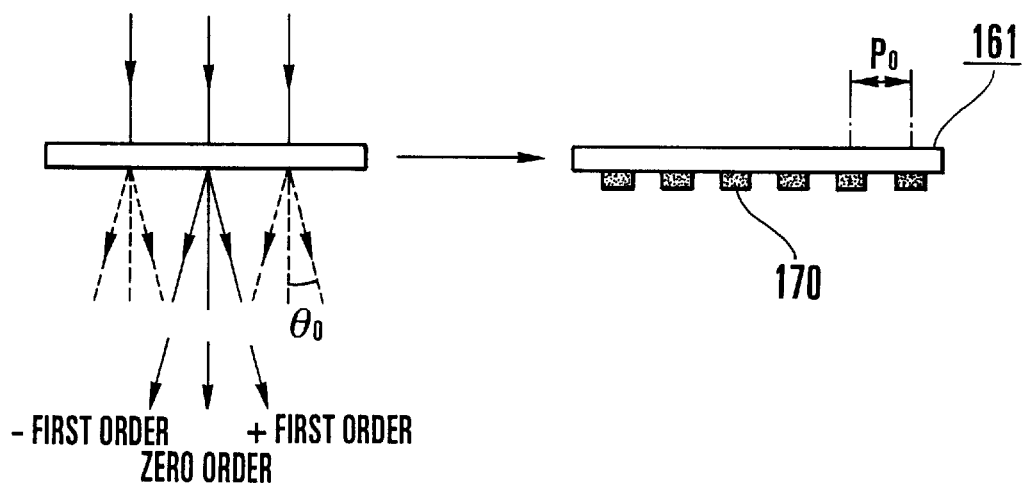
FIG. 7 is a schematic diagram showing a mask and an illumination method according to the invention.

Next, the structural arrangement of each of the pupil filter and the two-light-flux interference mask employed when the two-light-flux interference exposure is performed in the exposure apparatus shown in FIG. 5 is described by using the schematic diagrams of FIGS. 6 and 7.

FIG. 6 shows a projection exposure apparatus having a projection optical system composed of, for example, total refraction systems. In the projection exposure apparatus, the design wavelength is set to 248 nm and the numerical aperture NA is not less than 0.6. In FIG. 6, there are illustrated a two-light-flux interference mask 161, object-side exposure light 162, a projection optical system 163, an aperture stop 164, image-side exposure light 165, a photosensitive substrate (wafer) 166, and a schematic view 167 showing the positions of light fluxes on the pupil plane. In FIG. 6, which is a schematic diagram showing the state where the two-light-flux interference exposure is being performed, each of the object-side exposure light 162 and the image-side exposure light 165 is composed of two parallel light fluxes.

According to the invention, in order to perform the two-light-flux interference exposure in the ordinary projection exposure apparatus as described above, the two-light-flux interference mask 161 and the illumination method therefor are set as shown in FIG. 7.

FIG. 7 shows the two-light-flux interference mask 161, which has a one-dimensional periodic pattern in which the pitch $P_0$ of chromium-made light-blocking parts 170 is expressed by the following formula (a4)':

$$P_0 = \frac{2P}{M} = \frac{4R}{M} = \frac{\lambda}{NA \cdot M} \qquad (a4)'$$

where R is the resolution, $P_0$ is the pitch of the light-blocking parts 170 on the two-light-flux interference mask 161, P is the pitch of a periodic pattern on the photosensitive substrate 166, M is the magnification of the projection optical system 163, λ is the wavelength, and NA is the image-side numerical aperture of the projection optical system 163.

As shown in FIG. 6, the two-light-flux interference mask 161 is nearly perpendicularly illuminated in an almost coherent manner. Under the coherent illumination, light having passed through the two-light-flux interference mask 161, which falls on the projection optical system 163, includes a zero-order light flux which travels straightly, a − first-order light flux which travels in the direction of an angle −θ$_0$ and a + first-order light flux which travels in the direction of an angle +θ$_0$. The − first-order light flux and the + first-order light flux travel on the two sides of the zero-order light flux symmetrically with respect to the optical axis 163a of the projection optical system 163, and contribute to the image formation. In this case, the pupil filter (aperture stop) 164 is retractably arranged in the neighborhood of the pupil of the projection optical system 163 to remove the zero-order light flux so as to prevent the zero-order light flux from contributing to the image formation.

With the ordinary projection exposure apparatus commonly used in the above manner, the two-light-flux interference exposure is performed. Further, the use of the ± first-order light fluxes, according to this method, permits the two-light-flux interference mask to have a pitch which is twice as large as the pitch of the conventional mask arrangement in view of the projection magnification. Besides, the multiple exposure method according to the invention obviates the necessity of attaching a minute phase film to a mask as in the case of the Levenson-type mask, and is, therefore, advantageous also in respect to the making of masks.

The above explanation has been made about the examples of the two-light-flux interference mask 161 and the illumination method which are used for performing the two-light-flux interference exposure by means of the ordinary projection exposure apparatus. With the various elements of the two-light-flux interference mask 161 and the illumination method set in the above-described manner, it is possible to utilize the maximum area of the NA of the projection optical system.

Next, an explanation is made about a half-tone mask (hereinafter also referred to simply as the mask), according to a first embodiment of the invention, which is used in the projection exposure step shown in FIG. 1.

In the half-tone mask according to the first embodiment of the invention, unlike the conventional half-tone mask, while transmission factors thereof differ with the respective positions (areas) thereof, the amount of phase change between the areas which have finite transmission factors different from each other is adjusted to be "0" or to be an integer number of times as much as 2π, which is effectively the same as "0".

With the half-tone mask arranged in the above-described manner, the boundary portion between the areas having the respective different transmission factors has no change in the complex amplitude transmission factor. Therefore, the half-tone mask according to the first embodiment of the invention has an advantage that the actual transmission factors for forming an exposure pattern can be prevented from changing to be disordered.

Figure 8:
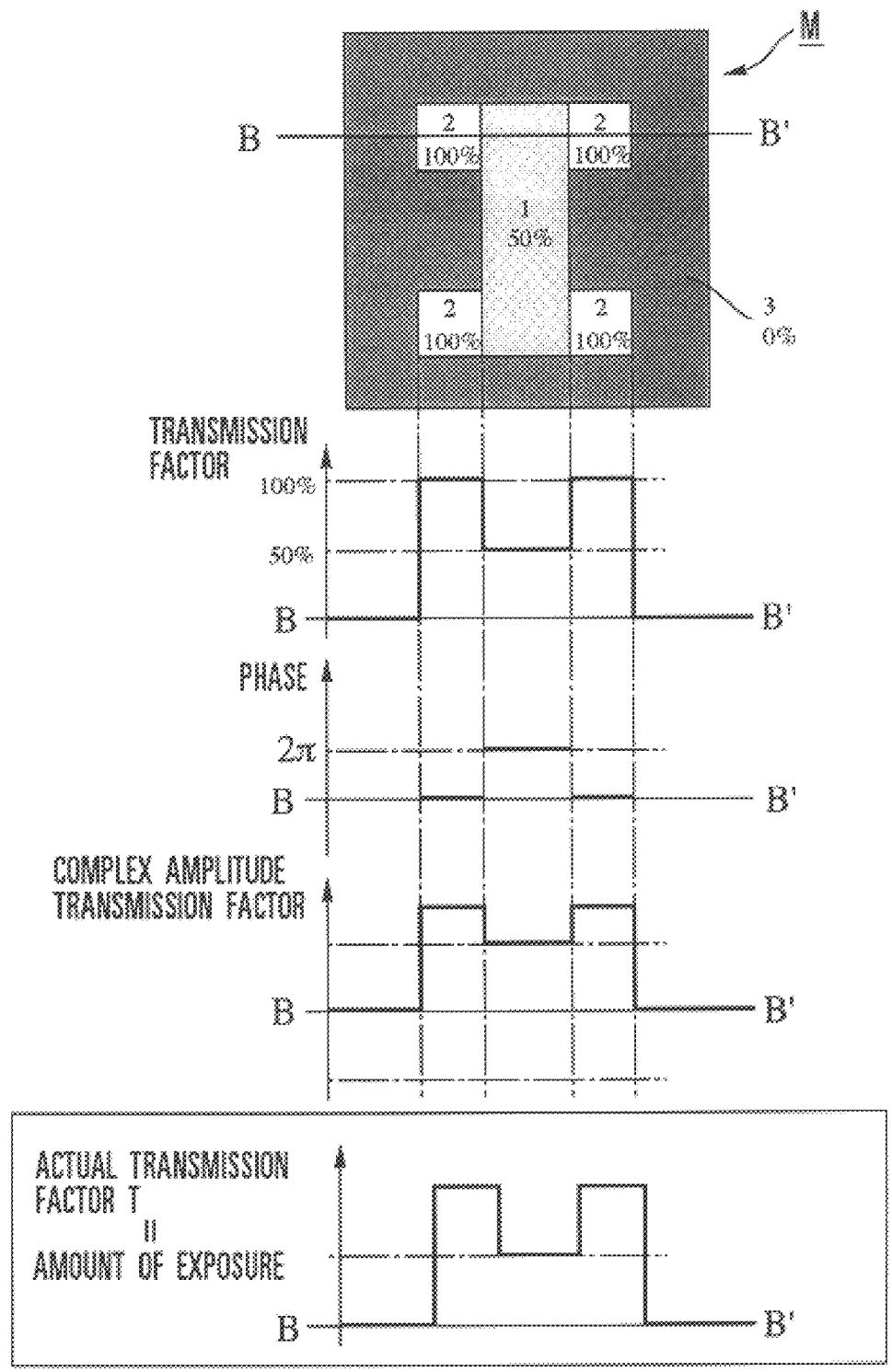
FIG. 8 is a diagram showing in outline the arrangement of essential parts of a mask according to a first embodiment of the invention.

FIG. 8 is a diagram for explaining, in outline, the essential parts of the half-tone mask M according to the first embodiment of the invention. In FIG. 8, an area of transmission factor T=50% is indicated by "1", an area of transmission factor T=100% is indicated by "2", and an area of transmission factor T=0% (i.e., a light-blocking part) is indicated by "3".

Next, the characteristic features of the mask M according to the first embodiment are described with reference to FIGS. 9 and 10.

Figure 9:
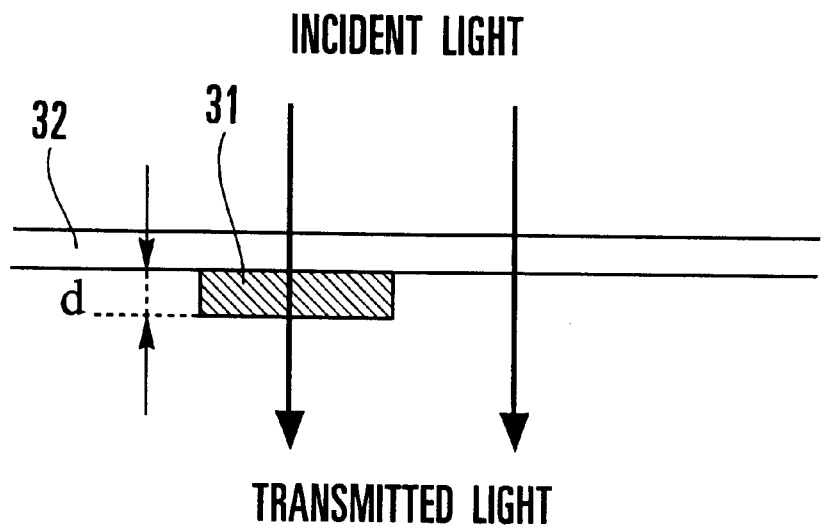
FIG. 9 is a diagram showing in outline the arrangement of essential parts of the mask according to the first embodiment of the invention.
Figure 9:
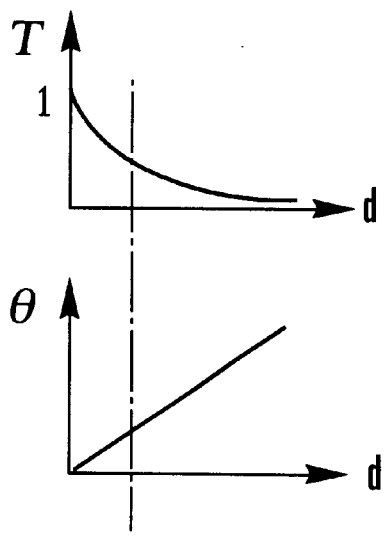

FIG. 9 is a diagram for explaining the relationships of the transmission factor and the amount of phase change with respect to the depth in the mask M shown in FIG. 8. In FIG. 9, reference numeral 32 denotes a substrate, and reference numeral 31 denotes a half-tone film. The transmission factor T and the amount of phase change θ for light passing through the half-tone film 31 vary according to the depth d of the half-tone film 31, and are respectively determined as expressed by the following formulas (1) on the basis of the absorption coefficient c and the refractive index n which are property values of the half-tone film 31:

$$T = e^{-cd}$$

$$\theta = 2\Pi \frac{nd}{\lambda} \quad (1)$$

where λ is the wavelength of light incident on the half-tone film 31 (exposure light).

In the first embodiment, a material to be used for the half-tone film 31 is selected on the basis of the above property values, and the half-tone mask M is prepared by setting the thickness d of the half-tone film 31 to a predetermined value (to be described later) on the basis of the property values of the selected material, so that the amount of phase change λ is set to an integer number of times as much as 2π.

Figure 10:
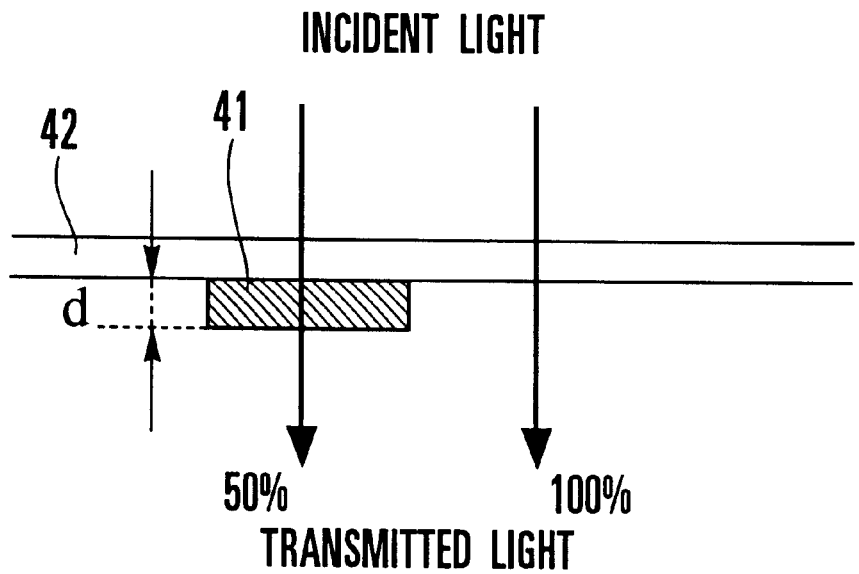
FIG. 10 is a diagram showing in outline the arrangement of essential parts of the mask according to the first embodiment of the invention.

In FIG. 10, there is schematically shown a sectional view of the mask M according to the first embodiment.

The mask M according to the first embodiment has light-blocking parts disposed in predetermined positions (not shown) and is, therefore, a half-tone mask having respective areas of three transmission factors 0%, 50% and 100%, including portions of two kinds of transmission factors shown in FIG. 10.

Referring to FIG. 10, reference numeral 42 denotes a substrate and reference numeral 41 denotes a half-tone film. Letting the refractive index, the absorption coefficient and the thickness of a material of the half-tone film 41 be denoted by n, c and d, respectively, and the wavelength be denoted by λ, the relations between the property values and the thickness concerning the transmission factor T (=0.5) of the portion of transmission factor 50% and the amount of phase change θ of transmitted light are expressed by the above formulas (1). In the first embodiment, the phase shift is set to 2π. Assuming that m is an integer, which is "0", "1", "2" or the like, if "θ=2mπ" is substituted into the second one of the formulas (1), the following formulas (2) are obtained:

$$d = \frac{m\lambda}{n} = \frac{(-\log T)}{c} \quad (2)$$

$$\frac{n}{c} = \frac{m\lambda}{(-\log T)}$$

The mask according to the first embodiment is prepared by using a material in which the value of "n/c" satisfies the second one of the formulas (2) and by setting the thickness d to a value obtained by the computation in the first one of the formulas (2). Accordingly, there is no phase shift between portions whose transmission factors are different finite values, i.e., 50% and 100%. Therefore, no abnormality occurs in an exposure pattern at the boundary between areas whose transmission factors are different from each other. FIG. 8 is a schematic diagram showing such a condition.

In the upper portion of FIG. 8, there is shown the surface of the half-tone mask M having three values of transmission factors (0%, 50% and 100%) according to the first embodiment. Further, in the middle portion of FIG. 8, there are shown the transmission factor and the amount of phase change of transmitted light which are obtained at the section B–B' of the half-tone mask M. In the case of the half-tone mask M shown in FIG. 8, the amount of phase change is set to 2π (m=1). Even if the phase changes as much as 2π, the complex amplitude transmission factor does not change, so that no abnormality occurs in an exposure pattern at the boundary between areas whose transmission factors are different from each other. In this instance, the area of transmission factor 100% is an area having a predetermined transmission factor reference value, and the area of transmission factor 50% is an area satisfying the above formulas (2).

Figure 11:
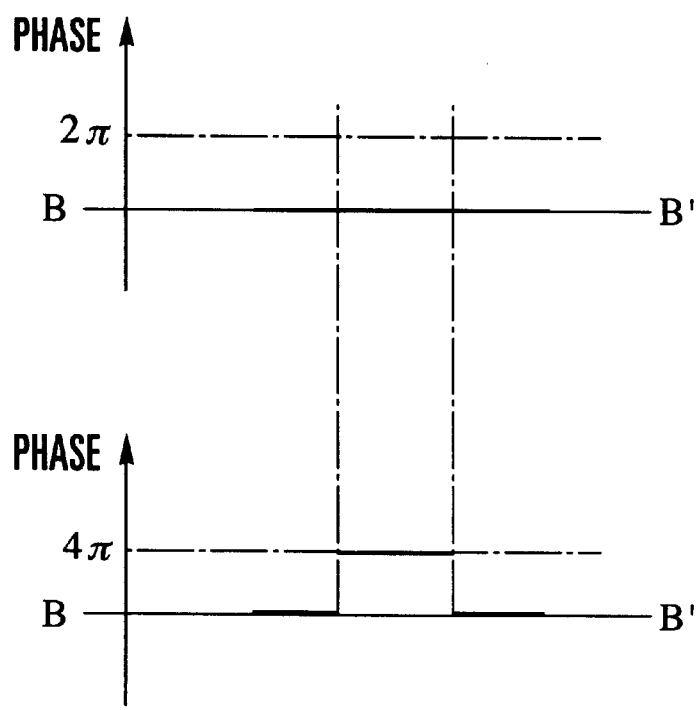
FIG. 11 is a diagram for explaining the mask according to the first embodiment of the invention.

Further, cases where the amount of phase change is set to "0" and "4π" (m=0, 2) are shown in FIG. 11. In these cases also, no abnormality occurs in an exposure pattern, entirely similar to the case of "2π" shown in FIG. 8.

It is to be noted that the formulas (2) may have somewhat errors and the predetermined object can be attained as long as the following condition is satisfied:

$$\left(m - \frac{1}{8}\right)\lambda < nd < \left(m + \frac{1}{8}\right)\lambda \quad \text{(where } m \text{ is an integer)}.$$

In the above condition, "nd" is an optical path length difference between light beams respectively passing an area of transmission factor 100% and an area of transmission factor 50%.

Figure 12:
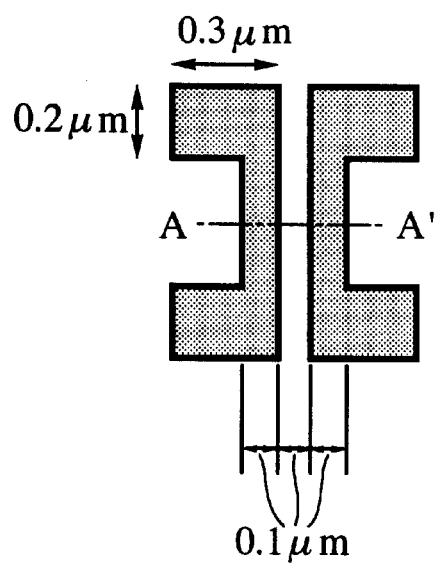
FIG. 12 is a schematic diagram showing a circuit pattern formed by using the mask according to the invention.

Next, an exposure method for the gate pattern using the above-described half-tone mask is described. In the first embodiment, the so-called gate pattern as shown in FIG. 12 is used as a circuit pattern to be obtained by an exposure. The gate pattern shown in FIG. 12 has such a characteristic that, while the line width in the horizontal direction, i.e., in the direction A–A', is 0.1 μm, the line width in the vertical direction is 0.2 μm or more. According to the invention, with regard to such a pattern that a high resolution is required only in a one-dimensional direction, the two-light-flux interference exposure can be performed in view of the resolution only in the one-dimensional direction requiring a high resolution. In the first embodiment, an example is shown in which the two-light-flux interference exposure to be performed in a one-dimensional manner is combined with the projection exposure.

Figure 13:
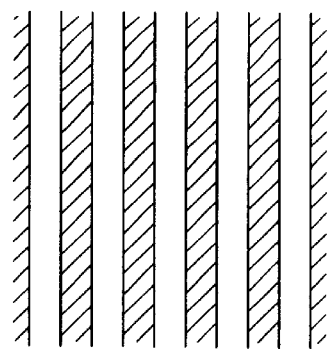
FIGS. 13(A) to 13(D) are schematic diagrams showing circuit patterns formed by the masks according to the invention.
Figure 13:
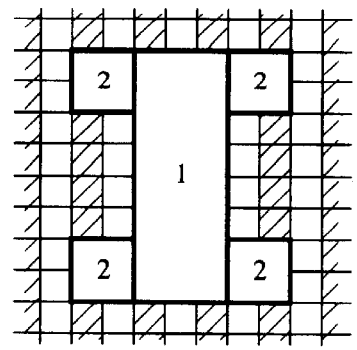
Figure 13:
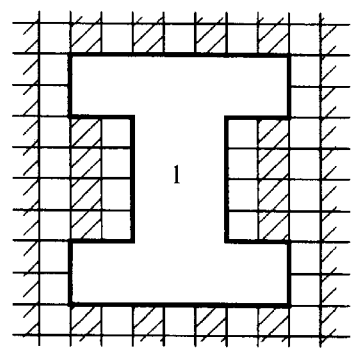
Figure 13:
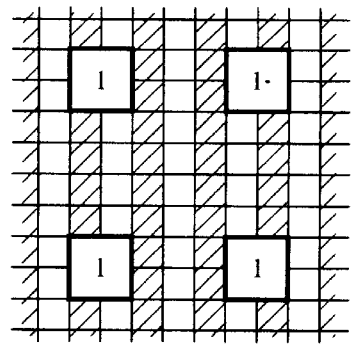

FIG. 13(A) shows a periodic exposure pattern formed by the two-light-flux interference exposure in a one-dimensional direction. The period of the periodic exposure pattern is 0.2 µm, which corresponds to a pattern of the line and space of 0.1 µm. Numerals shown in the lower portion of FIG. 13(A) represent the amounts of exposure.

Subsequently, the exposure method using the mask according to the first embodiment is described below. In the first embodiment, an exposure pattern shown in FIG. 13(B) is formed by the projection exposure step, which follows the two-light-flux interference exposure step in the multiple exposure method. In the upper portion of FIG. 13(B), there are illustrated the position of the exposure pattern relative to the interference fringes formed by the two-light-flux interference exposure, and the amounts of exposure at the respective areas of the exposure pattern formed by the projection exposure using the half-tone mask. The lower portion of FIG. 13(B) is a diagram obtained by mapping the amounts of exposure at the resolving power of the pitch of 0.1 µm.

It is found that the line width of the exposure pattern formed by the projection exposure step is two times as much as the line width of the exposure pattern formed by the two-light-flux interference exposure step, i.e., 0.2 µm.

Further, the method of performing such a projection exposure that has amounts of exposure which differ with the respective areas is attained by using the half-tone mask having a plurality of steps of transmission factors, in which a mask part corresponding to the area indicated by "1" in the upper portion of FIG. 13(B) is assigned a transmission factor of T% and a mask part corresponding to the area indicated by "2" is assigned a transmission factor of 2T%. According to this method, the projection exposure step can be completed by one exposure. In this case, a ratio among the amounts of exposure obtained on the photosensitive substrate by the respective exposure steps is as follows: "two-light-flux interference exposure":"projection exposure at the part of transmission factor T%":"projection exposure at the part of transmission factor 2T%"=1:1:2.

Next, the formation of an exposure pattern by the combination of the two-light-flux interference exposure step and the projection exposure step is described. In the case of the multiple exposure method according to the first embodiment, there is no developing step between the two-light-flux interference exposure step and the projection exposure step. Therefore, the amount of exposure obtained by one exposure step is added to the amount of exposure obtained by the other exposure step. Then, a total amount of exposure obtained by the addition causes a new exposure pattern to be formed.

FIG. 13(C) illustrates the results of addition of the amounts of exposure of the exposure pattern obtained by the above two kinds of exposure steps, i.e., the two-light-flux interference exposure step and the projection exposure step. Particularly, in the lower portion of FIG. 13(C), a pattern obtained by developing the exposure pattern shown at the upper portion of FIG. 13(C) is shown in a gray tone. Additionally stated, in the first embodiment, the exposure threshold value of the photosensitive substrate is a value not less than "1" and less than "2".

The pattern shown in gray at the lower portion of FIG. 13(C) coincides with the gate pattern shown in FIG. 12, so that it is found that the above multiple exposure method enables the formation of such a gate pattern.

Next, a half-tone mask according to a second embodiment of the invention is described.

The second embodiment is characterized in that, in preparing a half-tone mask such as that of the first embodiment shown in FIG. 8, a phase shifter for adjusting the amount of phase change is provided at a high transmission-factor part of the half-tone mask.

Figure 14:
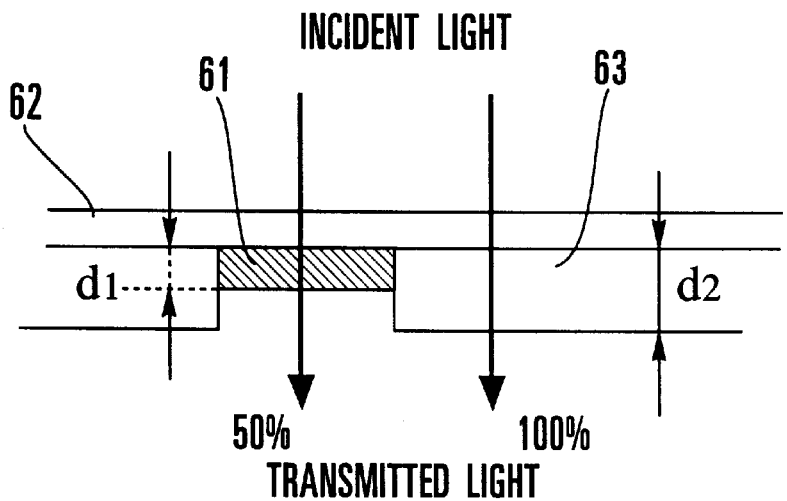
FIG. 14 is a diagram showing in outline the arrangement of essential parts of a mask according to a second embodiment of the invention.

FIG. 14 is a schematic diagram showing the section of the half-tone mask according to the second embodiment. Since light-blocking parts made of chromium are provided at applicable positions (not shown), the half-tone mask has three values of transmission factors, i.e., 0%, 50% and 100%, including the light-blocking parts as well as two kinds of light-transmitting parts shown in FIG. 14. In FIG. 14, reference numeral 62 denotes a substrate, reference numeral 61 denotes a half-tone film, and reference numeral 63 denotes a phase shifter.

The amount of phase change of transmitted light at the portion of transmission factor 50% relative to transmitted light at the portion of transmission factor 100% is similar to that described in the first embodiment. In the second embodiment, the refractive index, the absorption coefficient and the thickness of a material of the half-tone film 61 are denoted by $n_1$, $c_1$ and $d_1$, respectively. Further, in the second embodiment, the phase shifter 63 is provided at the portion of transmission factor 100% so as to adjust the phase change, and the refractive index, the absorption coefficient and the thickness of a material of the phase shifter 63 are denoted by $n_2$, $c_2$ and $d_2$, respectively. In this instance, the absorption coefficient $c_2$ is a very small value, i.e., almost "0", and the phase shifter 63 is thus made of a material whose transmission factor can be regarded as 100%. As such a material, quartz, which is the same as the material of the substrate 62, may be used. Further, the phase shifter 63 may be formed integrally with the substrate 62.

The transmission factor ratio T between the two kinds of transmission factors of the half-tone film 61 and the phase shifter 63 and the phase change difference θ between the half-tone film 61 and the phase shifter 63 are expressed by the following formulas (3):

$$T = \frac{e^{-c_1 d_1}}{e^{-c_2 d_2}} \qquad (3)$$

$$\theta = 2\Pi \frac{n_1 d_1 - n_2 d_2}{\lambda} = 2m\Pi$$

In the second embodiment, the phase change difference θ is adjusted to be "0" by the phase shifter 63. If "$c_2=0$" and "m=0" are substituted into the formulas (3), the following formulas (4) are obtained:

$$d_1 = \frac{(-\log T)}{c_1} \qquad (4)$$

$$d_2 = \frac{n_1}{n_2} d_1$$

In the second embodiment, the thickness of the phase shifter 63 is set to the value $d_2$ determined by the formulas (4). Accordingly, the phases between light rays passing through portions whose transmission factors are different values, i.e., 50% and 100%, are the same. Therefore, no abnormality occurs in an exposure pattern at the boundary between areas whose transmission factors are different from each other.

Next, a half-tone mask according to a third embodiment of the invention is described.

Figure 15:
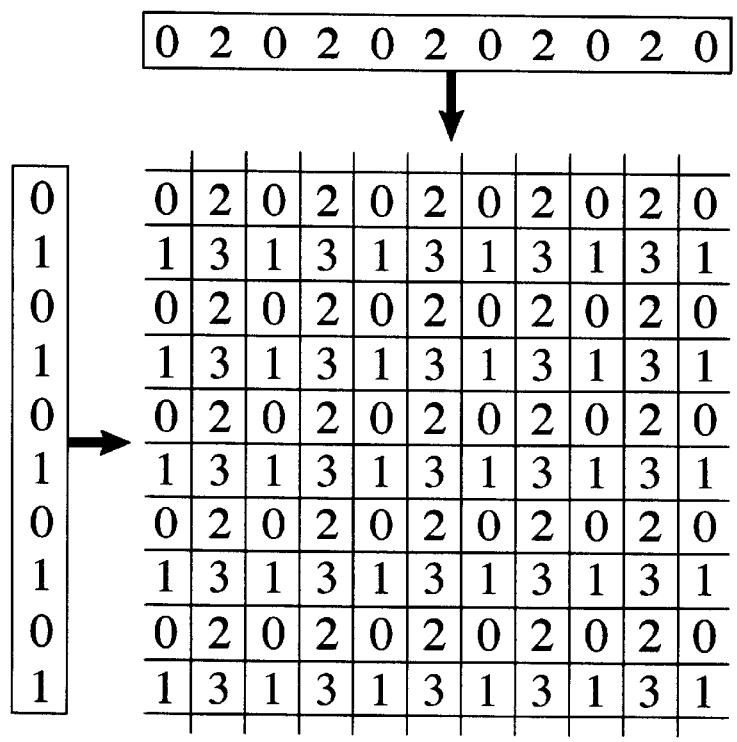
FIG. 15 is a schematic diagram for explaining a two-light-flux interference exposure pattern according to a third embodiment of the invention.

In a multiple exposure method using the half-tone mask according to the third embodiment, the two-light-flux interference exposure is performed two times to form two-dimensional interference fringes as an exposure pattern. FIG. 15 is a schematic diagram showing, in the form of a map of amounts of exposure, the exposure pattern obtained by the two-light-flux interference exposure in the third embodiment. In the third embodiment, in order to increase the variations of exposure patterns which are finally obtainable, the amounts of exposure for vertical interference fringes and horizontal interference fringes by the two-light-flux interference exposure are made different from each other (one amount being twice the other amount).

Figure 16:
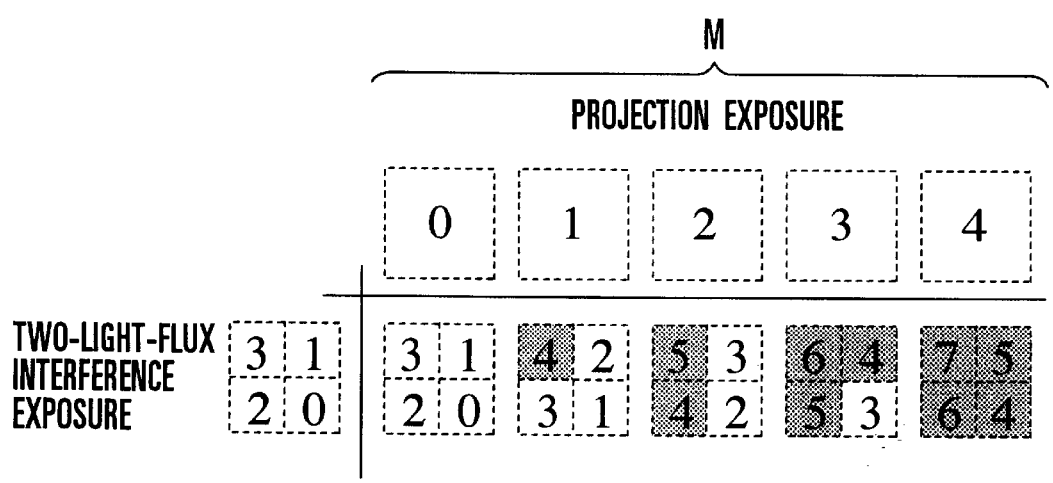
FIG. 16 is a diagram for explaining a mask according to the third embodiment of the invention.

In the exposure pattern shown in FIG. 15, as a result of the two-light-flux interference exposure being performed twice, there are obtained four steps of amounts of exposure, i.e., "0" to "3". The number of steps of exposure amounts by the projection exposure which is sufficiently effective for the above two-light-flux interference exposure is five or more. Then, the exposure threshold value of the photosensitive substrate is set to a value that is greater than "3", which is a maximum value of the amount of exposure by the two-light-flux interference exposure, and is less than "4", which is a maximum value of the amount of exposure by the projection exposure. In FIG. 16, "M" represents a half-tone mask having five steps of transmission factors according to the third embodiment.

In the lower portion of FIG. 16, there are shown the amounts of exposure in an exposure pattern which is obtainable by the projection exposure using the half-tone mask M which gives five steps of amounts of exposure (0, 1, 2, 3 and 4). Each hatched portion in FIG. 16 represents a place which is given an amount of exposure greater than the exposure threshold value, and these hatched portions constitute an exposure pattern.

Figure 17:
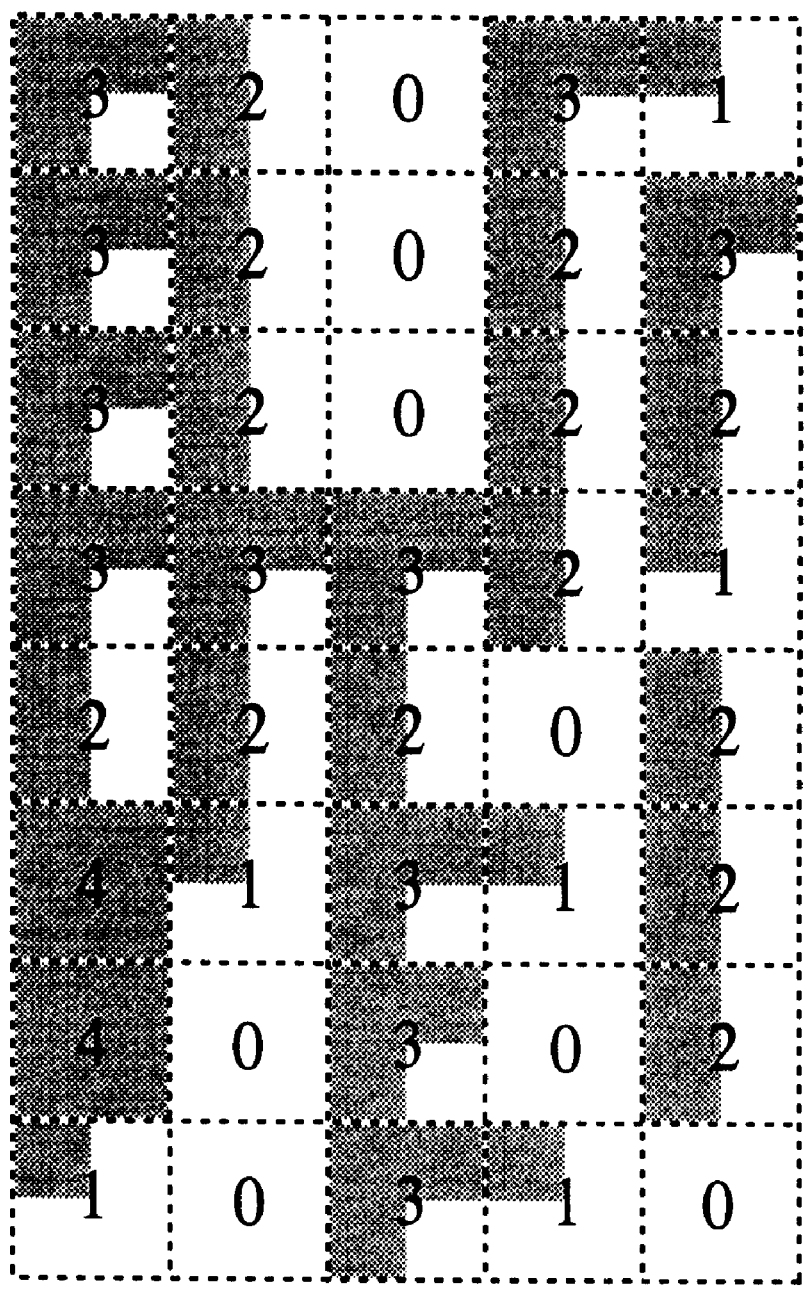
FIG. 17 is a diagram for explaining a pattern formed in the third embodiment of the invention.

FIG. 17 is a diagram for explaining an exposure pattern obtainable according to the third embodiment. The exposure pattern is formed over a wider area by varying the amount of exposure in the projection exposure in units of a block. In FIG. 17, numerals indicate the amounts of exposure of the respective blocks in the projection exposure step to form such an exposure pattern.

The projection exposure which gives the above five steps of amounts of exposure (0, 1, 2, 3 and 4) is performed once by using the multivalued half-tone mask M shown in FIG. 16.

Figure 18:
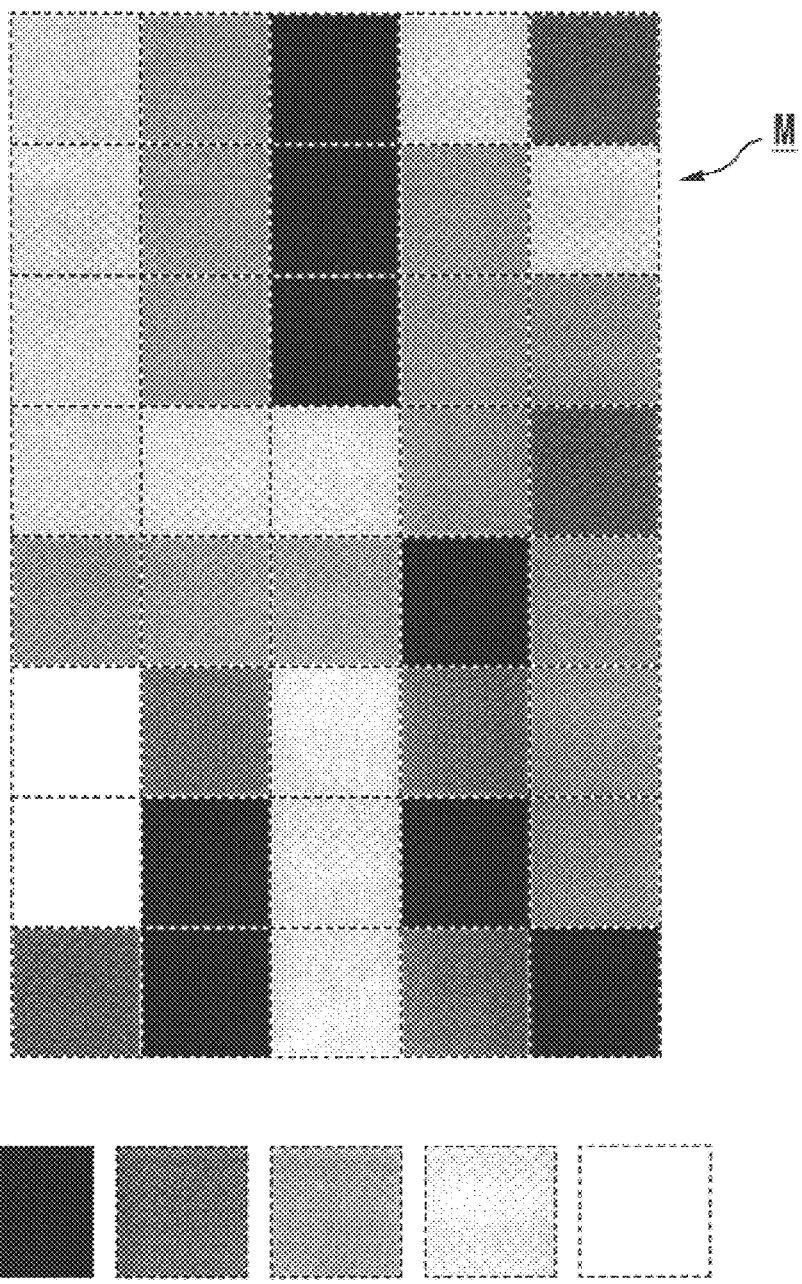
FIG. 18 is a diagram for explaining the mask used in the third embodiment of the invention.

As shown in the lower portion of FIG. 18, the half-tone mask M according to the third embodiment has five steps of transmission factors so as to bring about the five steps of amounts of exposure. A block having a transmission factor of 0% is a light-blocking part made of chromium, and a block having a transmission factor of 100% is made only of a transparent quartz substrate.

Each of blocks having respective transmission factors of 20%, 50% and 75% is formed by vapor-depositing a material having a refractive index n and an absorption coefficient c which satisfy the following equation:

$$\frac{n}{c} = \frac{m\lambda}{(-\log T)}$$

where T is "0.25", "0.50" or "0.75", m is an integer being "1", "2" or "3", and $\lambda$ is the wavelength.

With the half-tone mask arranged as described above, the amount of phase change becomes an integer number of times as much as $2\pi$ even at the boundary portion where the transmission factor changes. Therefore, an exposure pattern is given no change in the amount of exposure by the phase shifting effect. Accordingly, the desired exposure pattern as shown in FIG. 17 can be formed by superposing the exposure pattern formed by the projection exposure on the exposure pattern formed by the two-light-flux interference exposure.

In addition, while, in the above-described embodiments, a half-tone mask of the transmission type is explained, the essential structure thereof can be applied also to a half-tone mask of the reflection type.

Further, the invention is not limited to the above-described embodiments, and the flow of a sequence, etc., can be modified in diverse manners without departing from the spirit of the invention.

Next, a semiconductor-device manufacturing method using the projection exposure apparatus described above is described below also as a further embodiment of the invention.

Figure 19:
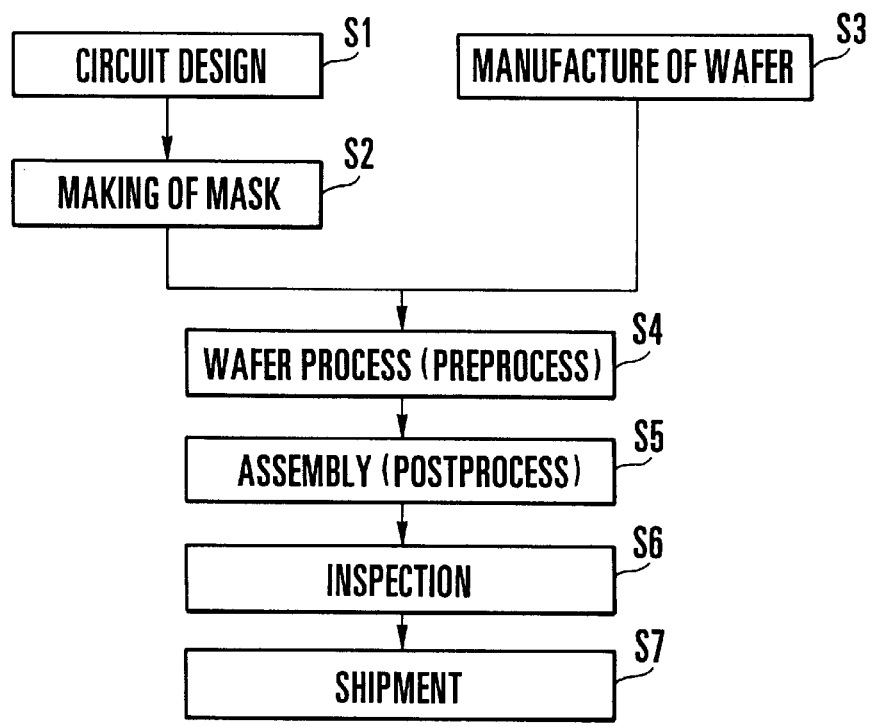
FIG. 19 is a flow chart showing a manufacturing method for a device according to the invention.

FIG. 19 is a flow chart showing a flow of processes for manufacturing a semiconductor device, such as a semiconductor chip including an IC or an LSI, a liquid crystal panel, a CCD or the like.

At a step S1 (circuit design), a circuit pattern for the semiconductor device is designed. At a step S2 (making of mask), a mask on which the designed circuit pattern is formed is made.

On the other hand, at a step S3 (manufacture of wafer), a wafer is manufactured by using a material such as silicon. At a step S4 (wafer process), which is called a preprocess, an actual circuit is formed on the wafer, by a lithography technique, using the mask and the wafer.

At the next step S5 (assembly), which is called a postprocess, the wafer processed at the step S4 is processed into a semiconductor chip through an assembly process (dicing and bonding), a packaging process (chip sealing), etc.

At a step 6 (inspection), the semiconductor device obtained at the step S5 is inspected by carrying out tests for its operation, its durability, etc. At a step S7 (shipment), the semiconductor device thus completed through the above processes is shipped.

Figure 20:
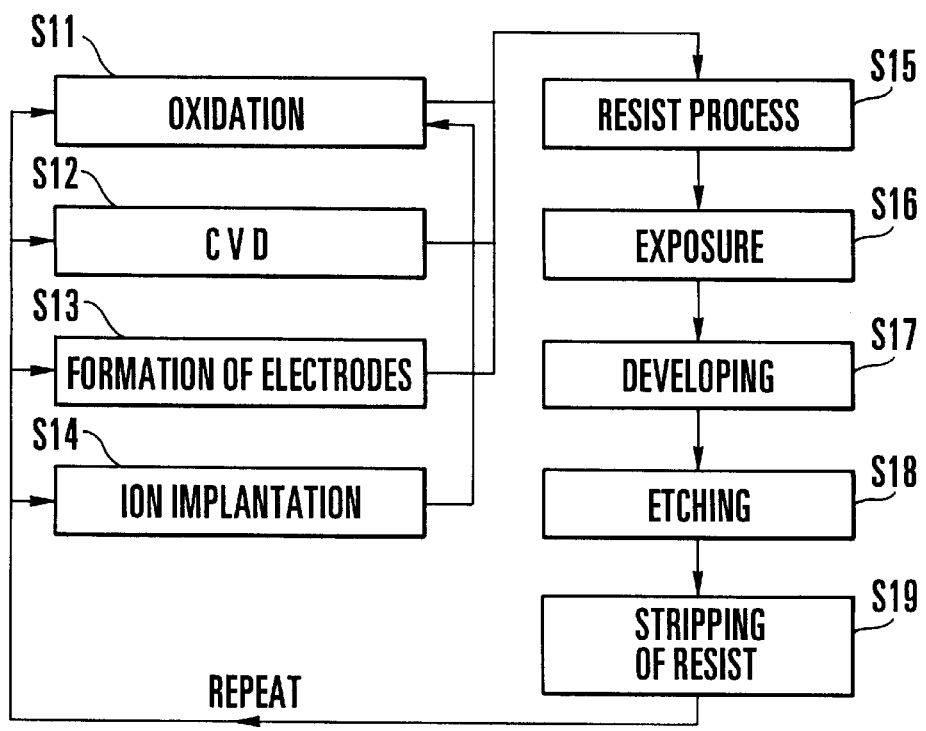
FIG. 20 is a flow chart showing the manufacturing method for a device according to the invention.
Figure 21:
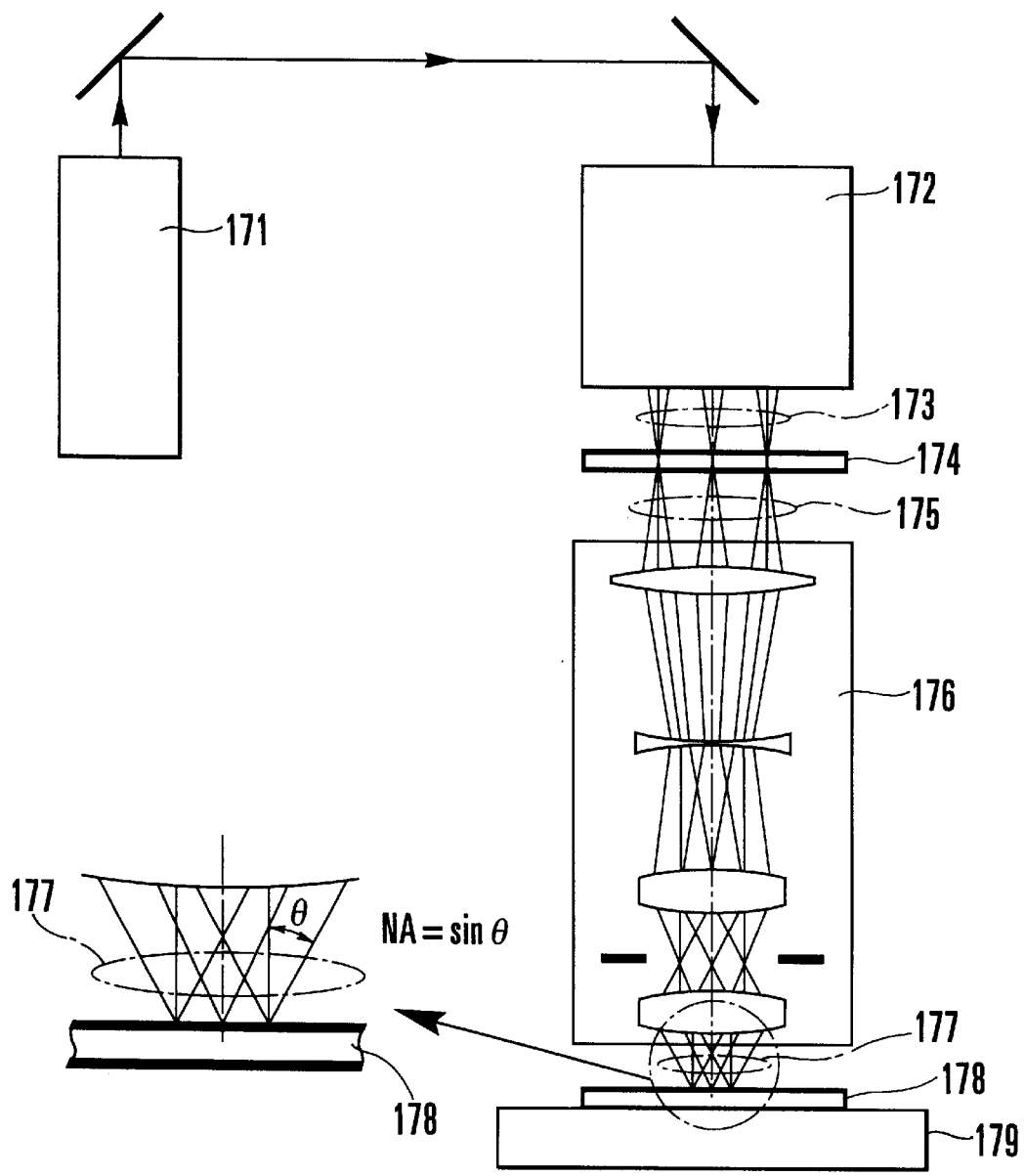
FIG. 21 is a schematic diagram showing the arrangement of a conventional projection exposure apparatus.
Figure 22:
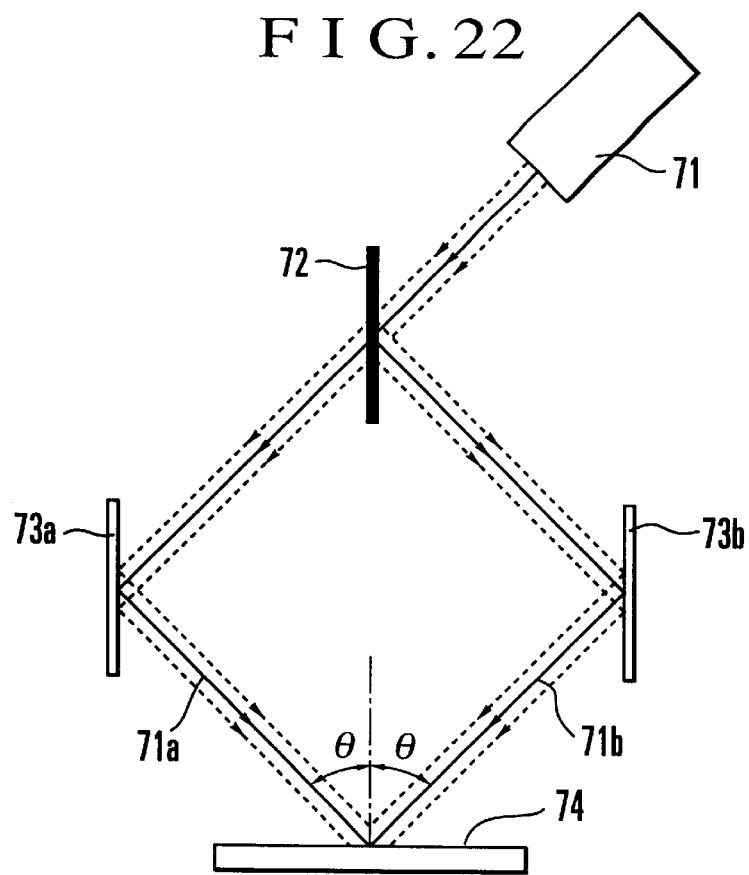
FIG. 22 is a diagram for explaining a conventional two-light-flux interference exposure apparatus.
Figure 23:
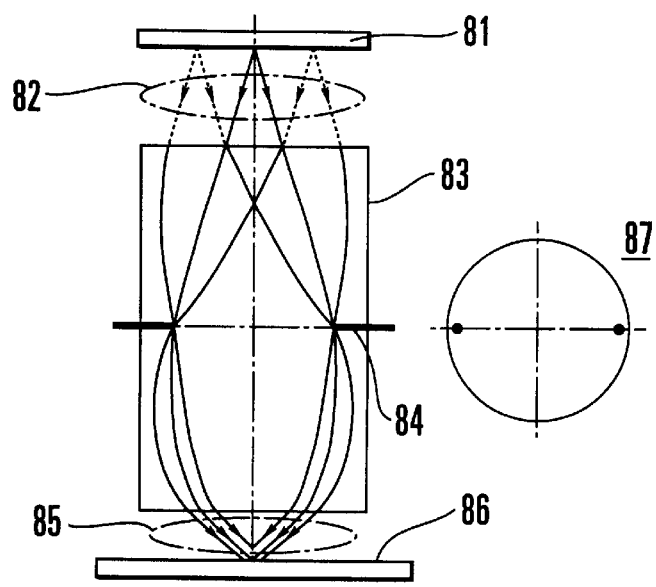
FIG. 23 is a diagram for explaining a conventional projection exposure apparatus capable of performing a two-light-flux interference exposure.
Figure 24:
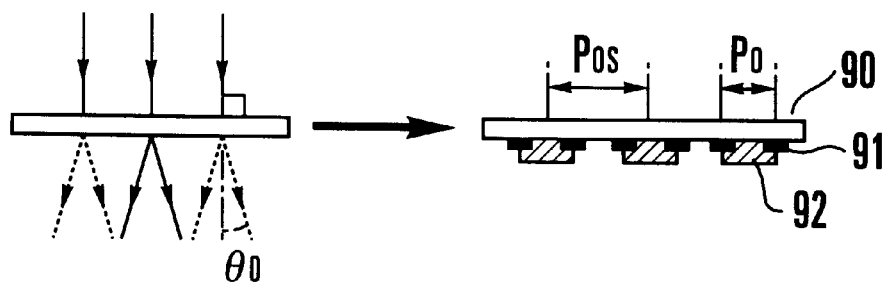
FIGS. 24(A) and 24(B) are diagrams for explaining the masks and the illumination method used in the conventional projection exposure apparatus shown in FIG. 23.
Figure 24:
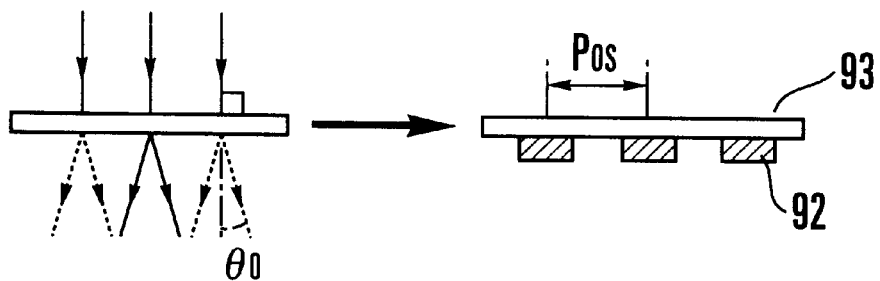
Figure 25:
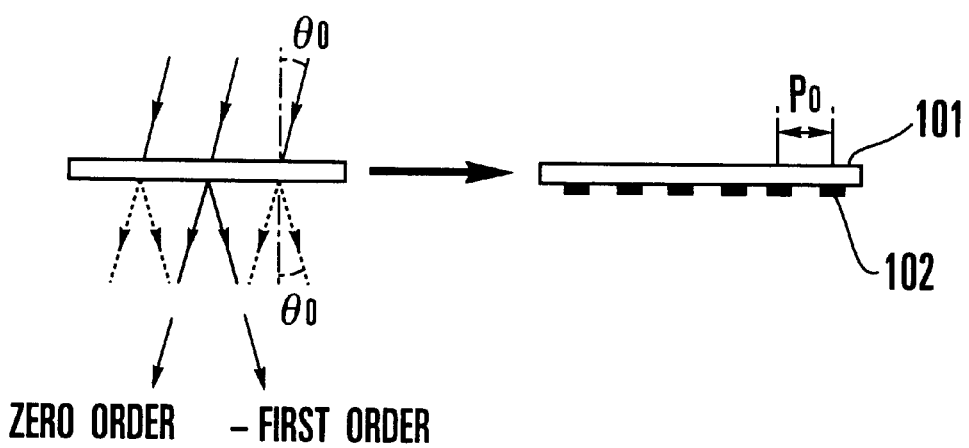
FIG. 25 is a diagram for explaining the mask and the illumination method used in the conventional projection exposure apparatus shown in FIG. 23.
Figure 26:
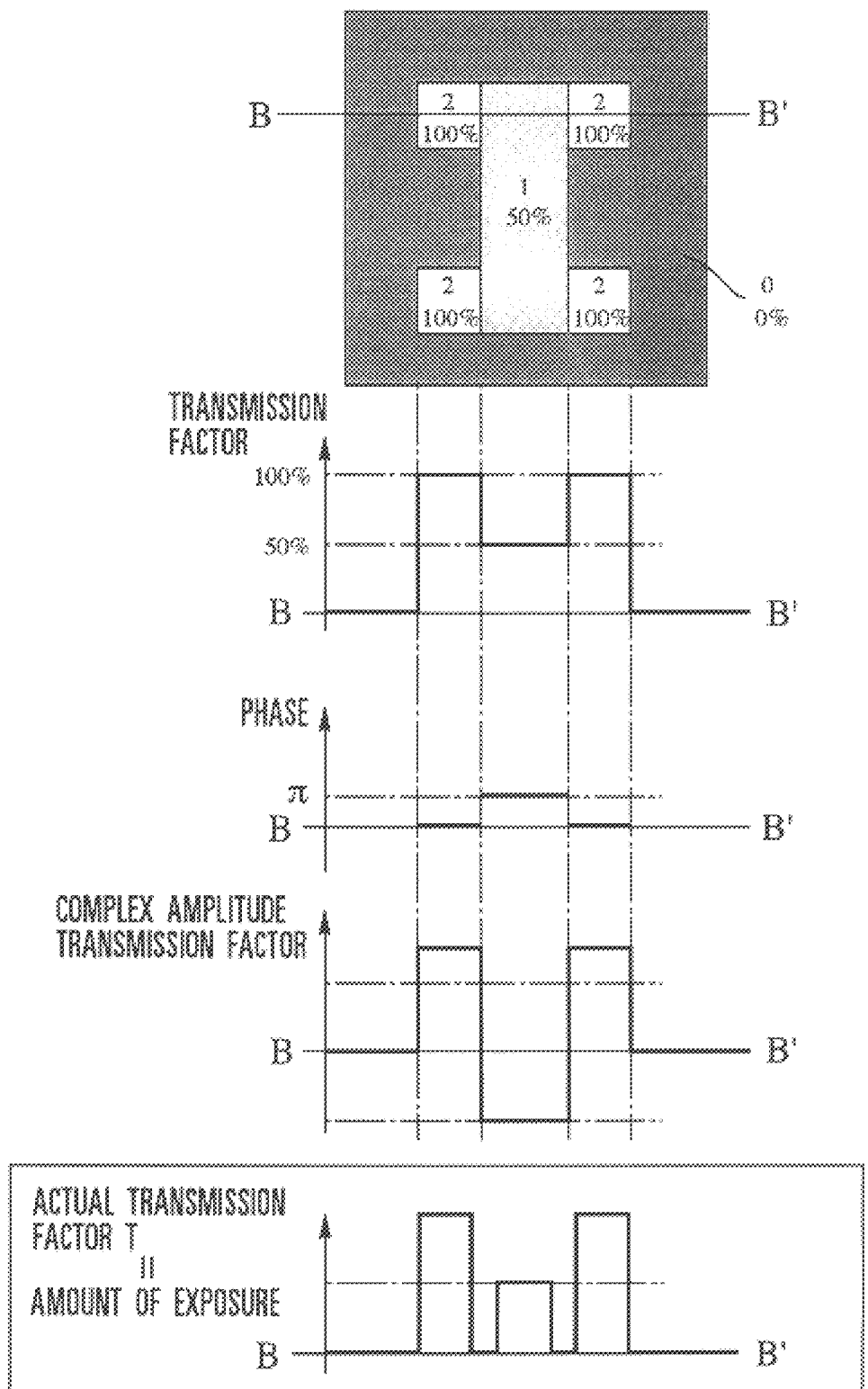
FIG. 26 is a diagram for explaining a conventional half-tone mask.

FIG. 20 is a flow chart showing the details of the wafer process of the above step S4. At a step S11 (oxidation), the surface of the wafer is oxidized. At a step S12 (CVD), an insulation film is formed on the surface of the wafer.

At a step S13 (formation of electrodes), electrodes are formed on the wafer by a vapor deposition process. At a step S14 (ion implantation), ions are implanted into the wafer. At a step S15 (resist process), a photosensitive material is coated to the wafer. At a step S16 (exposure), the circuit pattern of the mask is printed to the wafer by carrying out an exposure with the projection exposure apparatus described in the foregoing.

At a step S17 (developing), the exposed wafer is developed. At a step S18 (etching), parts other than the developed resist are scraped off. At a step S19 (stripping of resist), the resist, which has become unnecessary after completion of the etching process, is removed. With the above steps repeated, a multiple circuit pattern is formed on the wafer.

The manufacturing method according to the invention described above facilitates the manufacture of a semiconductor device of a high degree of integration, which has been difficult to attain by the conventional manufacturing method.

What is claimed is:

1. A mask comprising:
   a substrate transparent for an exposure beam; and
   a member translucent for said exposure beam formed on said transparent substrate, the transmission factor of said translucent member being different from a transmission factor of said transparent substrate, wherein a difference between an optical path length of said exposure beam passing through said transparent substrate and said translucent member and an optical path length of said exposure beam passing through said transparent substrate and the space adjacent to said translucent member on said transparent substrate is greater than $(m-1/8)\lambda$ and less than $(m+1/8)\lambda$, where $\lambda$ is a wavelength of the exposure beam and m is an integer.

2. A mask according to claim 1, wherein the wavelength $\lambda$ is in the following range:

150 nm<$\lambda$<440 nm.

3. An exposure method comprising a projection exposure step of projecting, by using a mask according to claim 1, a pattern image of the mask onto a photosensitive substrate, and a two-light-flux interference exposure step of forming a pattern image by using interference of two light fluxes.

4. A mask according to claim 1, wherein the transmission factor of said transparent pattern is at least 25%.

5. An exposure method comprising a step of transferring, by using a mask according to claim 1, a pattern image of the mask onto a photosensitive substrate.

6. A method for manufacture of a device, comprising a step of exposing a substrate by using an exposure method according to claim 5, and a step of developing the exposed substrate.

7. A reflection type mask in which an exposure beam reflected therein is used for exposure of a substrate, the mask comprising:

a substrate; and a reflective member having a reflection factor for said exposure beam formed on said substrate, the reflection factor being different from a reflection factor in a reflective area adjacent to said reflective member, wherein an optical path length difference between an exposure beam respectively reflecting in said reflective member and the reflective area is greater than $(m-1/8)\lambda$ and less than $(m+1/8)\lambda$, where $\lambda$ is a wavelength of the exposure beam and m is an integer.

8. A mask according to claim 7, wherein the wavelength $\lambda$ is in the following range:

150 nm<$\lambda$<440 nm.

9. An exposure method comprising a projection exposure step of projecting, by using a mask according to claim 7, a pattern image of the mask onto a photosensitive substrate, and a two-light-flux interference exposure step of forming a pattern image by using interference of two light fluxes.

10. An exposure method comprising a step of transferring, by using a mask according to claim 7, a pattern image of the mask onto a photosensitive substrate.

11. A method for manufacture of a device, comprising a step of exposing a substrate by using an exposure method according to claim 10, and a step of developing the exposed substrate.

12. A mask comprising:

a substrate transparent for an exposure beam; and a first member and a second member each translucent for said exposure beam and adjacent to each other, the transmission factors of said first and second members being different from each other, wherein a difference between an optical path length of an exposure beam passing through said transparent substrate and said first member and an optical path length of an exposure beam passing through said transparent substrate and said second member is greater than $(m-1/8)\lambda$ and less than $(m+1/8)\lambda$, where $\lambda$ is a wavelength of the exposure beam and m is an integer.

13. A mask according to 12, claim herein the wavelength k is in the following range:

150 nm<$\lambda$<440 nm.

14. An exposure method comprising a step of transferring, by using a mask according to claim 12, a pattern image of the mask onto a photosensitive substrate.

15. An exposure method comprising a projection exposure step of projecting, by using a mask according to claim 12, a pattern image of the mask onto a photosensitive substrate, and a step of forming a pattern image by using interference of two light fluxes.

16. A method for manufacture of a device, comprising a step of exposing a substrate by using an exposure method according to claim 14, and a step of developing the exposed substrate.

* * * * *

UNITED STATES PATENT AND TRADEMARK OFFICE
CERTIFICATE OF CORRECTION

PATENT NO.    : 6,632,574 B1  
DATED         : October 14, 2003  
INVENTOR(S)   : Mitsuro Sugita Page 1 of 1

It is certified that error appears in the above-identified patent and that said Letters Patent is hereby corrected as shown below:

Title page,  
Item [*] Notice, insert the following paragraph:  
-- This patent issued on a continued prosecution application filed under 37 CFR 1.53(d), and is subject to the twenty year patent term provisions of 35 U.S.C. 154(a)(2). --

Column 3,  
Line 22, "e" should read -- $\theta$ --.

Column 4,  
Line 55, "e" should read -- $\theta$ --.

Column 12,  
Line 66, "2n," should read -- $2\pi$, --.

Column 20,  
Line 25, "12, claim herein" should read -- claim 12, wherein --.  
Line 26, "k is" should read -- $\lambda$ is --.

Signed and Sealed this

Thirtieth Day of March, 2004

JON W. DUDAS  
*Acting Director of the United States Patent and Trademark Office*